(12) United States Patent
Mitchell et al.

(10) Patent No.: US 7,949,425 B2
(45) Date of Patent: May 24, 2011

(54) HIGH THROUGHPUT WAFER NOTCH ALIGNER

(75) Inventors: Robert J. Mitchell, Winchester, MA (US); Joseph Ferrara, Georgetown, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1202 days.

(21) Appl. No.: 11/634,697

(22) Filed: Dec. 6, 2006

(65) Prior Publication Data

US 2008/0138175 A1 Jun. 12, 2008

(51) Int. Cl.
*G07F 7/00* (2006.01)
(52) U.S. Cl. ........................ 700/228; 700/218
(58) Field of Classification Search ............... 700/228, 700/218, 248, 213; 414/939, 941, 217, 940, 414/995
See application file for complete search history.

(56) References Cited

U.S. PATENT DOCUMENTS

| | | | |
|---|---|---|---|
| 5,357,115 A | 10/1994 | Asakawa et al. | |
| 5,565,034 A | 10/1996 | Nanbu et al. | |
| 5,980,195 A | 11/1999 | Miyashita | |
| 5,989,346 A | 11/1999 | Hiroki | |
| 6,719,517 B2 * | 4/2004 | Beaulieu et al. | 414/217 |
| 6,855,916 B1 | 2/2005 | Matthews et al. | |
| 6,896,513 B2 | 5/2005 | Bachrach et al. | |
| 7,010,388 B2 | 3/2006 | Mitchell et al. | |
| 7,019,263 B2 * | 3/2006 | Ishihara | 219/390 |
| 2002/0014407 A1 | 2/2002 | Allen et al. | |
| 2003/0057130 A1 * | 3/2003 | Fix et al. | 206/710 |
| 2003/0091410 A1 * | 5/2003 | Larson et al. | 414/217 |
| 2003/0123958 A1 | 7/2003 | Sieradzki et al. | |
| 2004/0191028 A1 * | 9/2004 | Tamai | 414/217 |
| 2004/0234359 A1 * | 11/2004 | Mitchell et al. | 414/217 |
| 2005/0063799 A1 * | 3/2005 | Larson et al. | 414/217 |
| 2005/0274459 A1 | 12/2005 | Tanase et al. | |
| 2007/0189880 A1 * | 8/2007 | Bufano et al. | 414/217 |
| 2007/0264106 A1 * | 11/2007 | van der Meulen | 414/217 |
| 2008/0138178 A1 | 6/2008 | Ferrara | |
| 2008/0217812 A1 * | 9/2008 | Perrone | 264/241 |

OTHER PUBLICATIONS

Non-Final Office Action Dated Jun. 18, 2010 from U.S. Appl. No. 11/634,644, 9 Pages.

* cited by examiner

*Primary Examiner* — Gene Crawford
*Assistant Examiner* — Ramya Prakasam
(74) *Attorney, Agent, or Firm* — Eschweiler & Associates, LLC

(57) ABSTRACT

An ion implantation apparatus, system, and method are provided for a transferring a plurality of workpieces between vacuum and atmospheric pressures, wherein an alignment mechanism is operable to align a plurality of workpieces for generally simultaneous transportation to a dual-workpiece load lock chamber. The alignment mechanism comprises a characterization device, an elevator, and two vertically-aligned workpiece supports for supporting two workpieces. First and second atmospheric robots are configured to generally simultaneously transfer two workpieces at a time between load lock modules, the alignment mechanism, and a FOUP. Third and fourth vacuum robots are configured to transfer one workpiece at a time between the load lock modules and a process module.

37 Claims, 16 Drawing Sheets

HIGH THROUGHPUT WAFER NOTCH ALIGNER

FIELD OF THE INVENTION

The present invention relates generally to workpiece processing systems and methods for processing workpieces, and more specifically to a system and method for handling and aligning workpieces wherein throughput is maximized.

BACKGROUND OF THE INVENTION

In semiconductor processing, many operations may be performed on a single workpiece or semiconductor wafer. In general, each processing operation on a workpiece is typically performed in a particular order, wherein each operation waits until completion of a preceding operation, thus affecting the time at which the workpiece will become available for a subsequent processing step. Tool productivity or throughput for relatively short processes performed under vacuum, such as ion implantation, can be severely limited if the process flow leading to the processing location is interrupted by sequential events associated with such processing. For example, operations such as an exchange of workpieces between transport carriers or storage cassettes and the processing system, a transfer of the workpiece from an atmospheric environment into an evacuated environment of an implantation chamber of the processing system, and an orientation of the workpiece (e.g., notch alignment) within the evacuated environment, can have a significant impact on tool productivity.

Processing of a workpiece, such as ion implantation, for example, is typically performed at a reduced pressure within an implantation chamber, wherein ions are generally accelerated along a beam line, and wherein the ions enter the evacuated implantation chamber and strike the workpiece in a predetermined manner. Several operations are typically performed leading up to the implantation in order to introduce the workpiece into the implantation chamber, as well as to properly position and orient the workpiece with respect to the ion beam within the ion implantation chamber. For example, the workpiece is transferred via a robot from an atmospheric cassette or storage device into a load lock chamber, wherein the load lock chamber is subsequently evacuated in order to bring the workpiece into the processing environment of the ion implanter. The cassette or storage device, for example, may be delivered to the ion implanter via a conveyor system or other type of delivery.

Front opening unified pods (FOUPs), for example, have become a popular mechanism for moving silicon workpieces or wafers from one workstation to another in an integrated circuit (IC) fabrication facility. Different versions of these FOUPs are commercially available from different manufacturers, including Asyst Technologies and Brooks Automation. A FOUP containing a number of stacked wafers, for example, is delivered from one tool to a next subsequent tool by an automated delivery device such as an overhead transport. The overhead transport deposits the pod to a location within the reach of a robot so that a robotic arm can extract one or more silicon wafers from the pod for treatment.

U.S. Pat. No. 5,486,080 to Sieradzki, for example, details a system for transferring wafers for vacuum processing. The system employs two wafer transport robots for moving wafers from two load locks past a processing station. Additional patents relating to serial end stations are U.S. Pat. Nos. 6,350,097, 6,555,825, and 5,003,183. Further, commonly-owned U.S. Pat. No. 7,010,388 to Mitchell et al. details a wafer handling system for handling one or two wafers at a time.

It is desirable for the workpiece handling system to have very high throughputs in order to reduce the tool's cost of ownership. This is especially true in an ion implantation process when a duration of the implantation is very short compared to the time needed to transfer a new workpiece from the FOUP to the process chamber and back to the FOUP. The actual ion implantation into a workpiece for a low dose implant, for example, has a short duration, wherein implant times can be less than 5 seconds. Further, as part of pre-processing routines utilized in ion implantation, each workpiece must be oriented properly relative to the ion beam. A mechanism known as an aligner is used for such an alignment step, where each workpiece is aligned serially, thus potentially decreasing throughput.

Therefore, a need exists for a system and method for facilitating high throughput by allowing simultaneous placement of two workpieces by an atmospheric wafer handling robot at the aligner station for subsequent serial alignment by the aligner mechanism. Since two wafers can be dropped off simultaneously, the atmospheric wafer handling robot can proceed onto other tasks which allow the wafer robot to handle more wafers per hour.

SUMMARY OF THE INVENTION

The present invention overcomes the limitations of the prior art by providing a system, apparatus, and method for transferring workpieces between atmospheric and vacuum environments, while maximizing throughput and minimizing costs of ownership associated with the systems. More particularly, the present invention provides a system and method for reducing a cost of ownership of the system by minimizing an idle time, or the amount of time a processing system is operating but not producing a processed workpiece.

Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a workpiece handling system and method for handling workpieces, and an alignment apparatus and method for using same. In accordance with one exemplary aspect of the invention, the workpiece handling system comprises one or more workpiece transport containers configured to support a plurality of workpieces, and a front end module in selective engagement with the workpiece transport container(s). In one example, the front end module comprises a first robot having a first dual-workpiece handling arm operably coupled thereto, a second robot having a second dual-workpiece handling arm operably coupled thereto, and an alignment mechanism disposed generally therebetween. The alignment mechanism comprises a characterization device, an elevator mechanism, and two or more vertically-aligned workpiece supports configured to respectively selectively support two or more of the plurality of workpieces. The elevator mechanism is operable to both rotate and translate vertically with respect to an axis associated therewith, and the two or more workpiece supports are operable to translate radially with respect to the axis. The elevator mechanism is thus operable to individually vertically translate each workpiece from the respective workpiece supports to a characterization position, wherein the elevator mechanism is further operable to determine one or more characteristics of each of the plurality of workpieces at the characterization position, such as a rotational position and/or center of each workpiece via the rotation of the workpiece with respect to the characterization device.

The system further comprises a vacuum chamber having a third robot and a fourth robot disposed therein, wherein the third robot comprises a first single-workpiece handling arm operably coupled thereto, and the fourth robot comprises a second single-workpiece handling arm operably coupled thereto. A processing module is further operably coupled to the vacuum chamber for processing the plurality of workpieces through a process medium, such as an ion beam. First and second load lock modules are operably coupled to both the front end module and the vacuum chamber, wherein each of the first and second load lock modules comprise two or more dual-workpiece load lock chambers configured to respectively support two or more workpieces therein. For example, first, second, third, and fourth dual-workpiece load lock chambers are provided, wherein the first load lock module comprises the first and third load lock chambers, and the second load lock module comprises the second and fourth load lock chambers, wherein each of the first, second, third, and fourth load lock chambers are configured to support the two or more of the plurality of workpieces therein.

In accordance with one exemplary aspect, the first robot is configured to selectively transfer one or more workpieces at a time (e.g., concurrently transfer two workpieces in parallel) between the workpiece transport container, the alignment mechanism, and the second load lock module via the first dual-workpiece handling arm. The second robot is further configured to selectively transfer one or more workpieces at a time (e.g., concurrently transfer two workpieces in parallel) between another workpiece transport container, the alignment mechanism, and the first load lock module via the second dual-workpiece handling arm. The third robot is configured to selectively serially transfer one workpiece at a time between the first load lock module and the process module via the first single-workpiece handling arm, and the fourth robot is configured to selectively serially transfer one workpiece at a time between the second load lock module and the process module via the second single-workpiece handling arm. A controller is further provided, wherein the controller is configured to selectively transfer the plurality of workpieces between the workpiece transport container, alignment mechanism, first and second load lock modules, and process module via a control of the first, second, third, and fourth robots, alignment mechanism, and first and second load lock modules.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
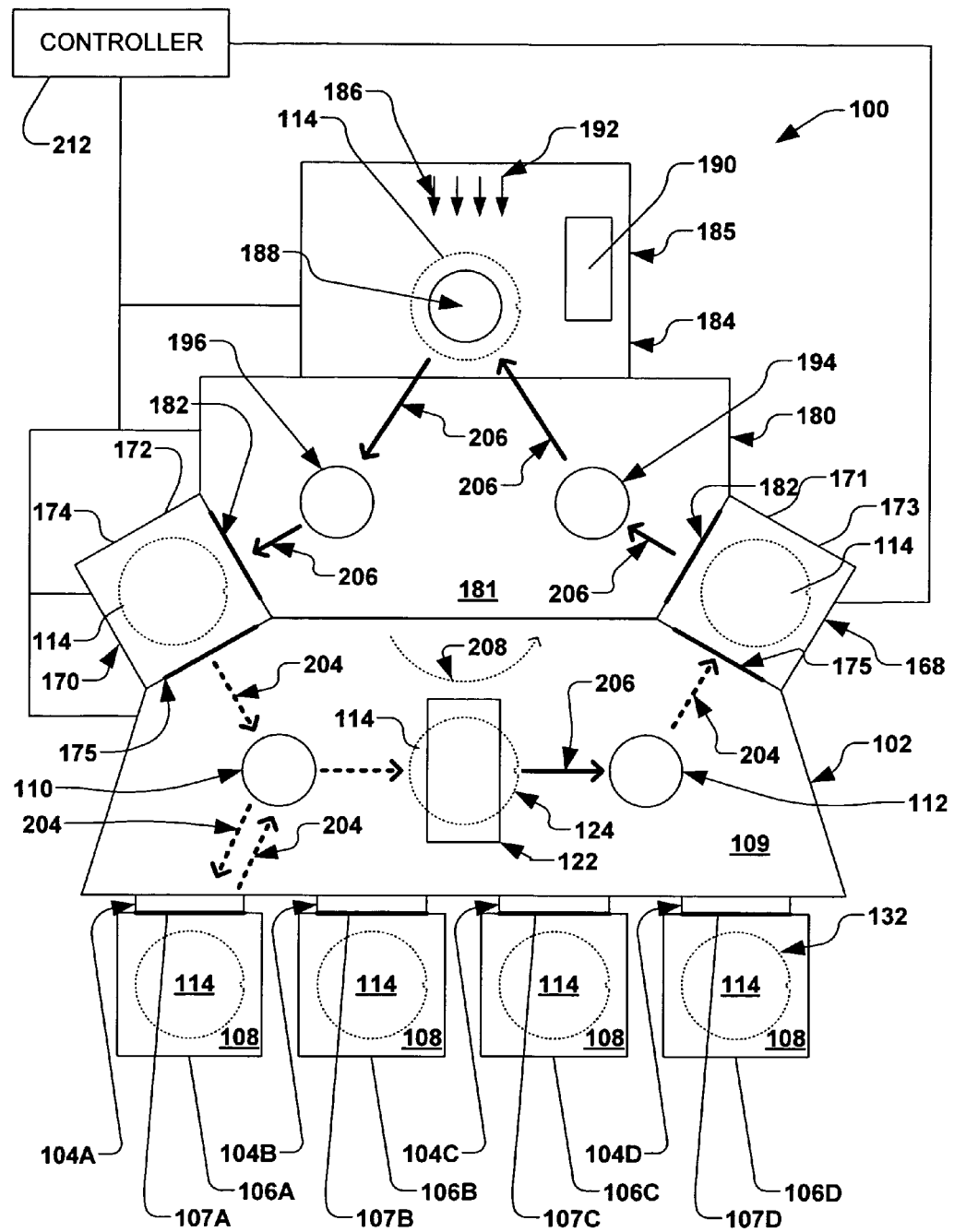
FIG. 1A illustrates a block diagram of an exemplary workpiece handling system in accordance with one aspect of the present invention.

The present invention is directed generally toward a workpiece handling system for semiconductor processes, and more particularly, to a handling system wherein two or more workpieces can be transferred within the system generally simultaneously, while still achieving serial operations such as alignment and ion implantation into the workpiece. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Figure 1B:
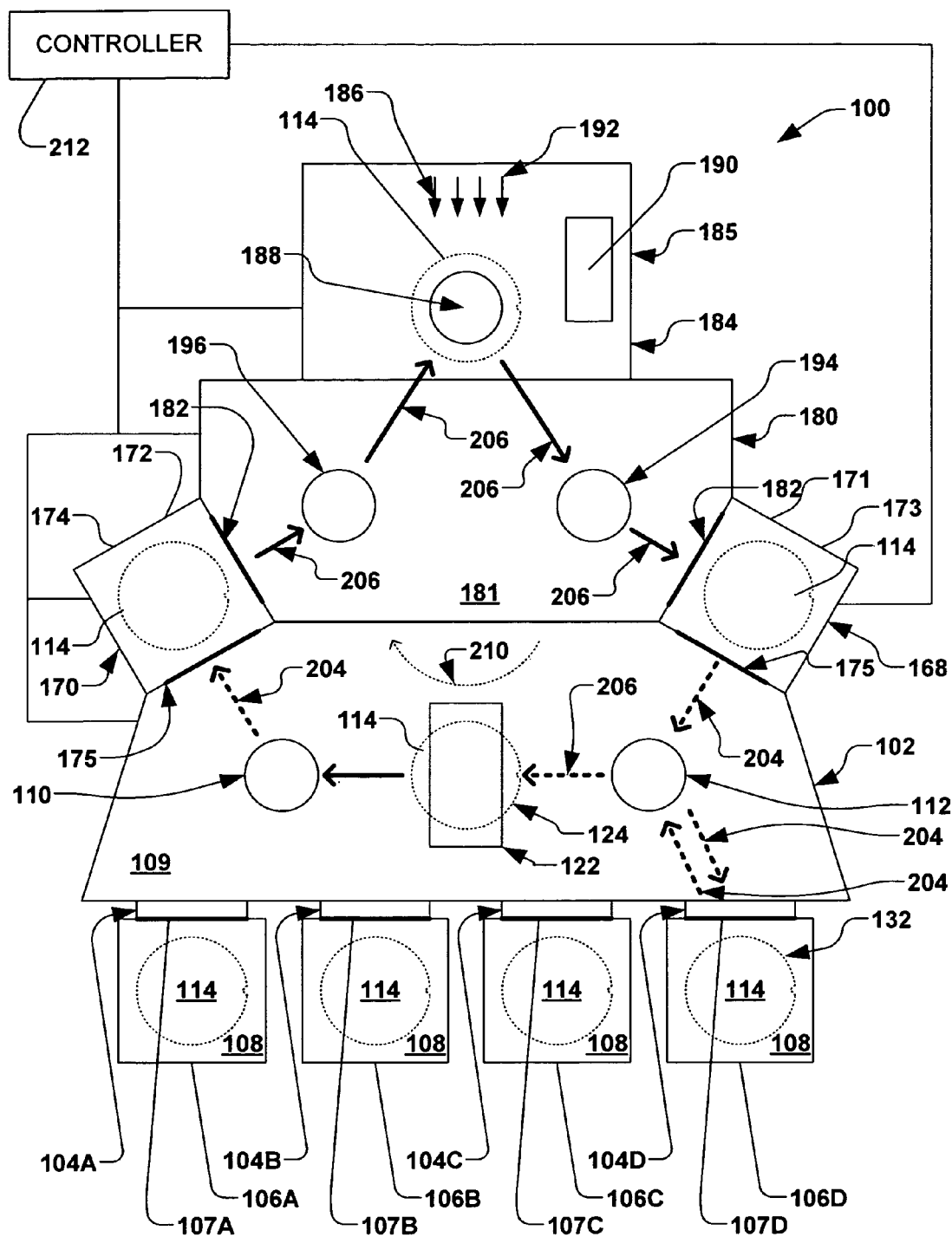
FIG. 1B illustrates the exemplary workpiece handling system of FIG. 1A having a reverse workpiece flow.

Referring now to the figures, FIGS. 1A and 1B illustrate an exemplary workpiece handling system 100 in accordance with one exemplary aspect of the present invention. The workpiece handling system 100, for example, comprises a front end module 102, wherein the front end module comprises one or more load ports 104A-104D operable to receive one or more workpiece transport containers 106A-106D. Each of the load ports 104A-104D, for example, comprises a door 107A-107D operable to provide selective communication between the respective workpiece transport containers 106A-106D and the front end module 102. The workpiece transport containers 106A-106D, for example, comprise Front Opening Unified Pods (FOUPs) 108, wherein each FOUP is operable to interface with the front end module 102. An internal environment 109 of the front end module 102, for example, is generally at or near atmospheric pressure.

The front end module 102 comprises a first robot 110 and a second robot 112, wherein, for example, the first robot is operable to load and unload a plurality of workpieces 114 (e.g., 300 mm semiconductor wafers) from the workpiece transport containers 106A and 106B, and the second robot is operable to load and unload a plurality of workpieces from the workpiece transport containers 106C and 106D. Each of the first and second robots 110 and 112, for example, are capable of multiple degrees of freedom including vertical, radial and azimuthal movements.

Figure 2:
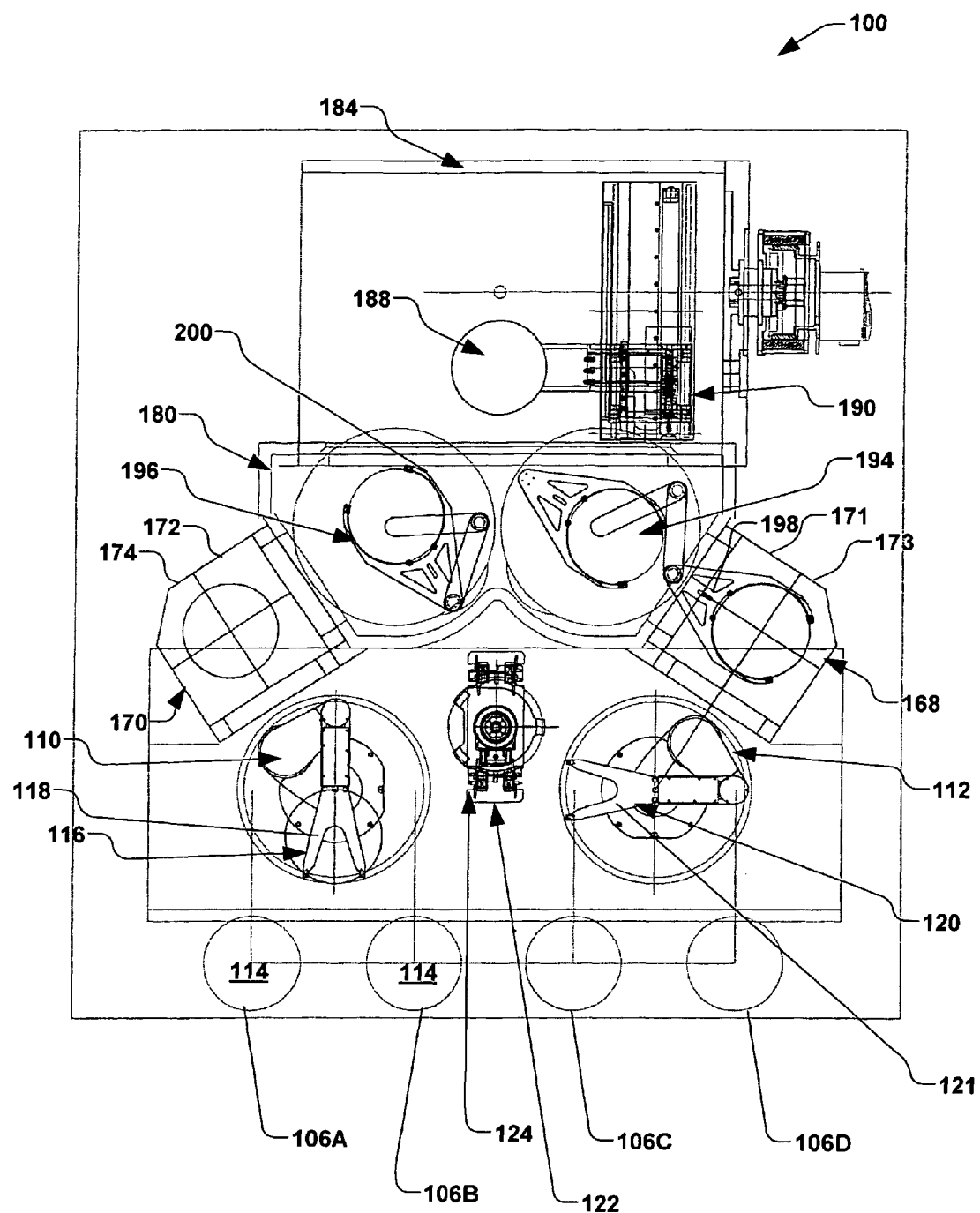
FIG. 2 illustrates schematic of an exemplary workpiece handling system in accordance with another aspect of the present invention.

As illustrated in greater detail in FIG. 2, in accordance with the present invention, the first robot 110 comprises a first dual-workpiece handling arm 116 operably coupled thereto, wherein the first dual-workpiece handling arm, for example, comprises a first dual support member 118 operable to support one or multiple workpieces 114 thereon. For example, the first dual-workpiece handling arm 116 is configured to concurrently or generally simultaneously retrieve and replace two of the plurality of workpieces 114 from and to the workpiece transport containers 106A and 106B via a control of the first robot 110. The first dual-workpiece handling arm 116, for example, may be further operable to support a single workpiece 114, as opposed to supporting multiple workpieces. The second robot 112, for example, comprises a second dual-workpiece handling arm 120 operably coupled thereto, wherein the second dual-workpiece handling arm is likewise configured to simultaneously retrieve and replace two of the plurality of workpieces 114 from and to the workpiece transport containers 106C and 106D via a control of the second robot. For example, the second dual-workpiece handling arm 120 comprises a second dual support member 121 operable to support one or multiple workpieces 114 thereon. In a similar manner to the first dual-workpiece handling arm 116, the second dual-workpiece handling arm 120 may be further operable to support a single workpiece 114, as opposed to supporting multiple workpieces.

Figure 3A:
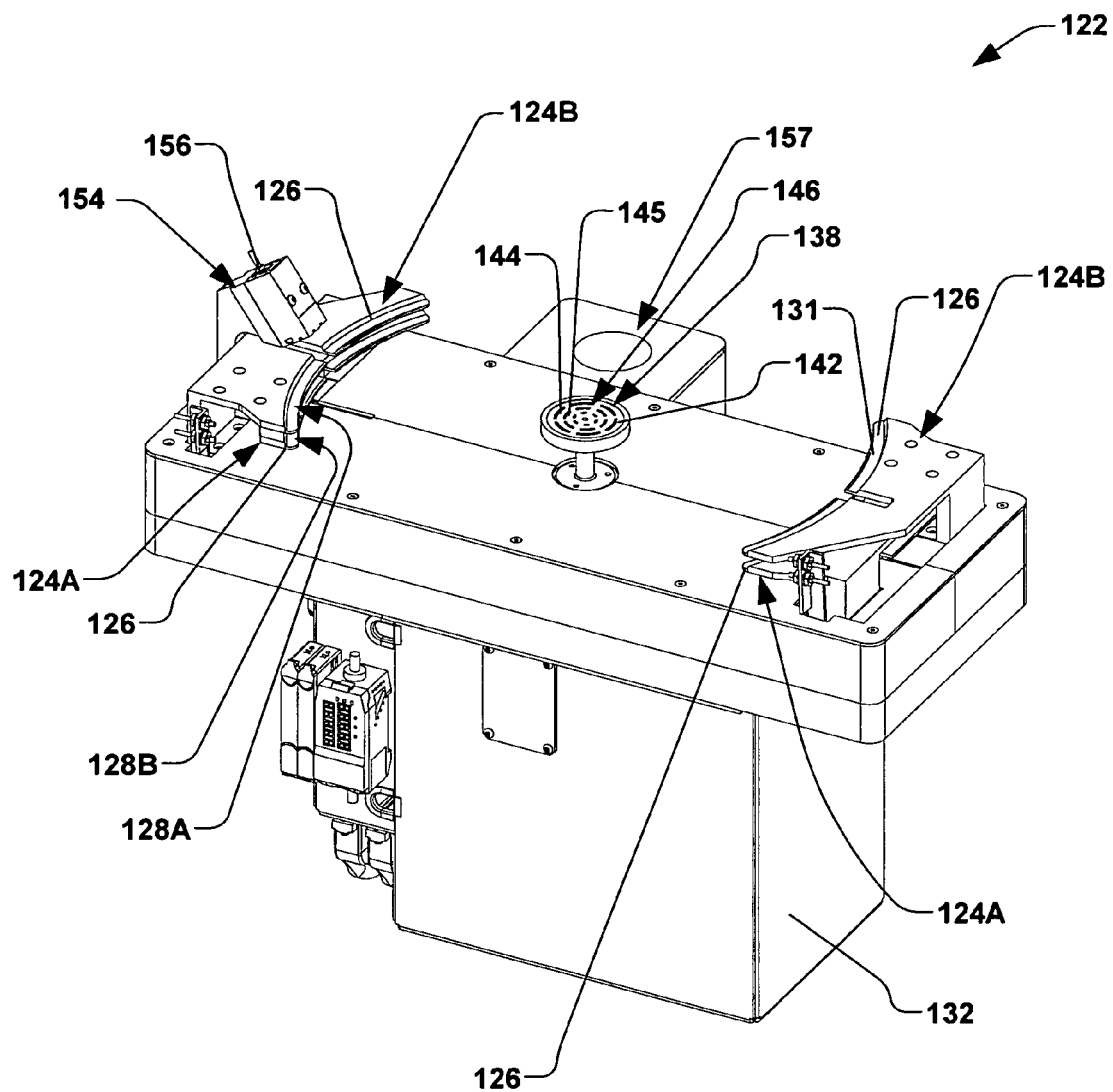
FIG. 3A illustrates a perspective view of an exemplary alignment mechanism according to another aspect of the present invention.

The front end module 102 of the present invention, as illustrated in FIGS. 1A-1B and FIG. 2 further comprises an alignment mechanism 122 disposed generally between the first and second robots 110 and 112, wherein the alignment mechanism is operable to determine one or more characteristics of the plurality of workpieces 114. FIG. 3A illustrates a perspective view of the exemplary alignment mechanism 122, wherein two or more vertically-aligned workpiece tray stations 124A and 124B are provided, and wherein each of the tray stations further comprise two or more workpiece supports 126 associated therewith. The two or more workpiece supports 126 associated with each workpiece tray station 124A and 124B, for example, are operable to support a respective workpiece 114, as illustrated in phantom in a top view 127 of the alignment mechanism 122 in FIG. 3B. The two or more workpiece tray stations 124A and 124B of FIG. 3A, for example, further generally define two or more respective buffer positions 128A and 128B, wherein the two or more buffer positions provide a buffering or cueing of the plurality of workpieces 114 of FIGS. 1A-1B and FIG. 2 via the alignment mechanism 122, as will be discussed in greater detail hereafter. It should be noted that the alignment mechanism 122 may comprise more than two workpiece tray stations 124 and buffer positions 128, and such multiple workpiece tray stations and buffer positions are contemplated as falling within the scope of the present invention.

Figure 3B:
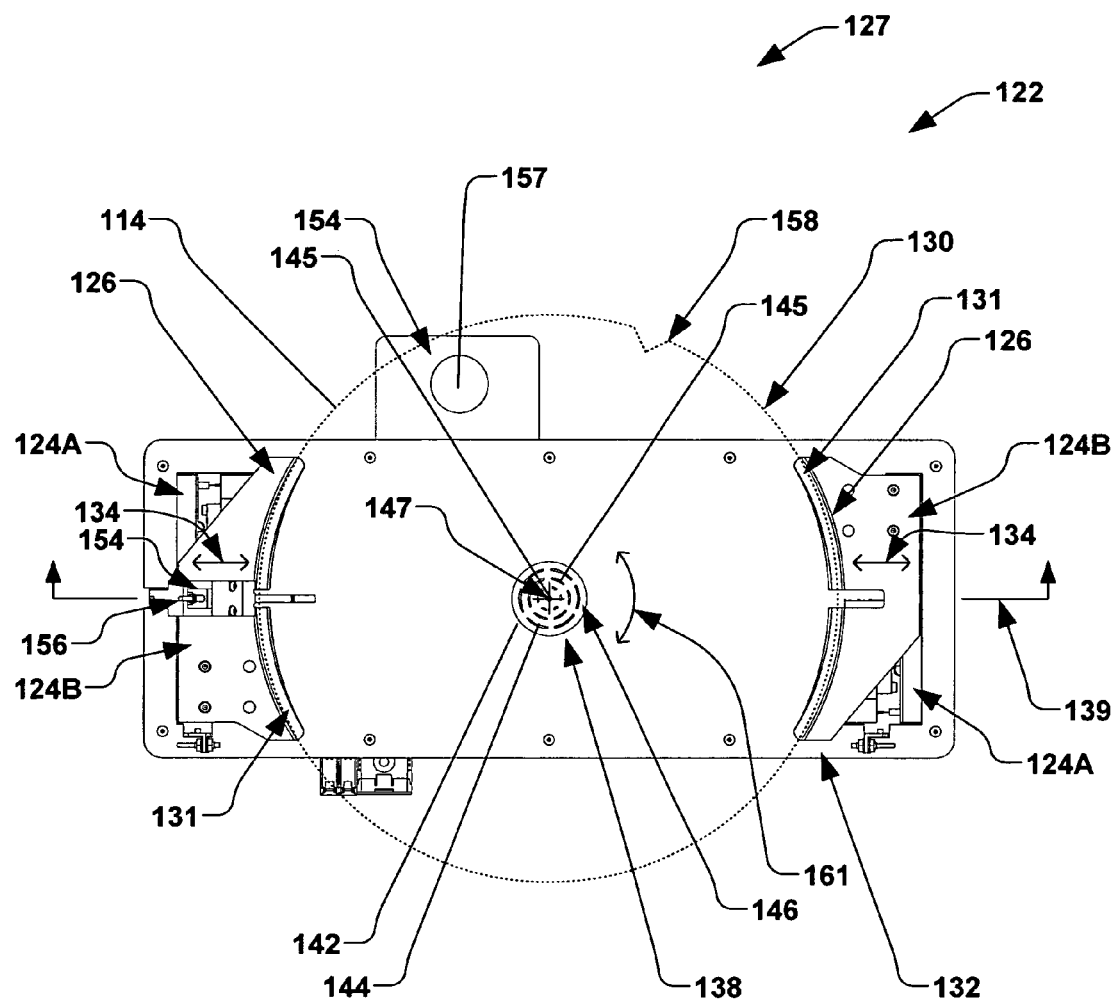
FIG. 3B illustrates a plan view of the exemplary alignment mechanism of FIG. 3A.

In the present example, as illustrated in FIG. 3B, each of the workpiece supports 126 associated with the respective workpiece tray stations 124A and 124B are further associated with a circumference or perimeter 130 of the plurality of workpieces 114. For example, the plurality of workpiece supports 126 are generally arcuate in shape, and have a recess 131 formed therein, wherein the recess is configured to generally support the workpiece 114 about at least a portion of its circumference 130. The plurality of workpiece supports 126 may alternatively take a number of other forms, such as supporting posts or prongs (not shown). Accordingly, any member operable to support the workpiece 114 is contemplated as falling within the scope of the present invention.

Figure 4A:
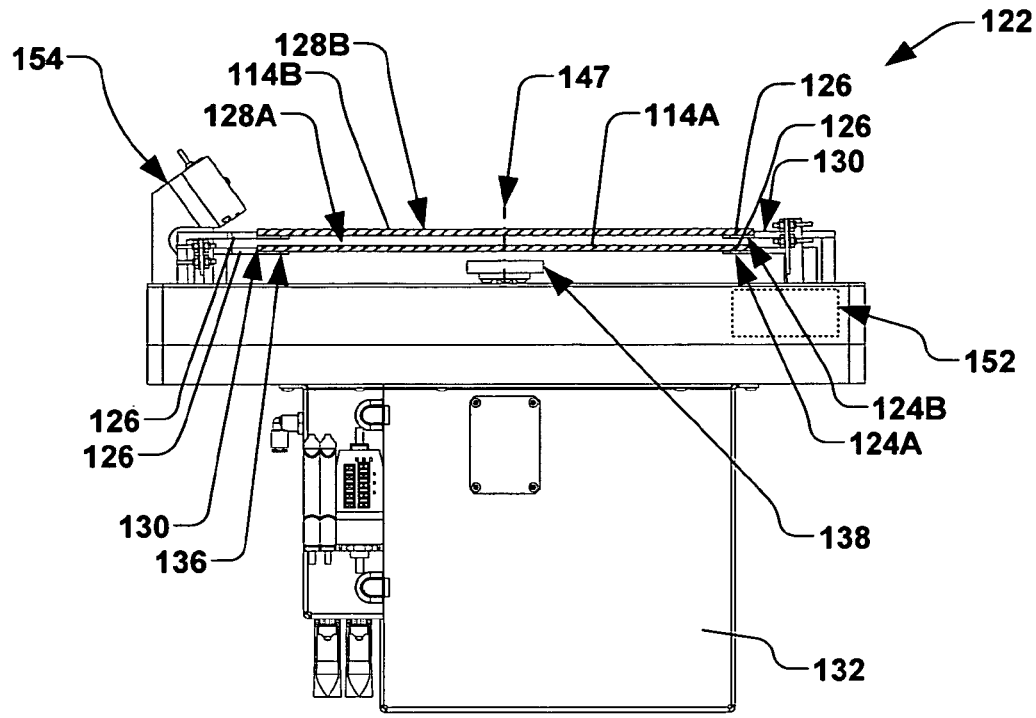
FIGS. 4A-4F illustrate the exemplary alignment mechanism of FIGS. 3A and 3B during various stages of workpiece alignment according to another exemplary aspect of the invention.
Figure 4B:
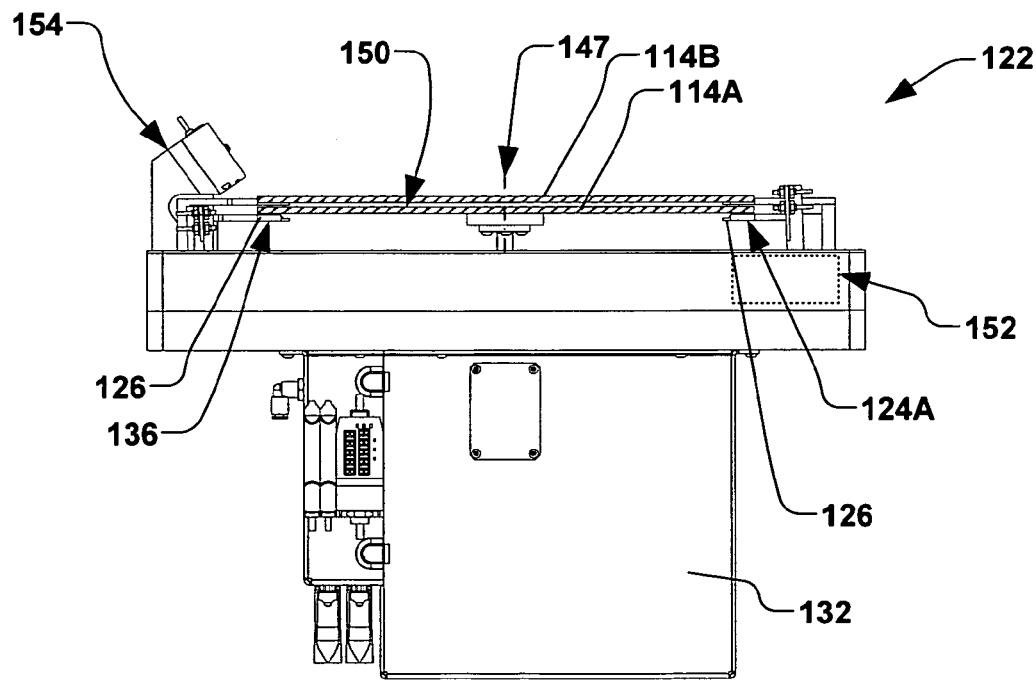
Figure 4C:
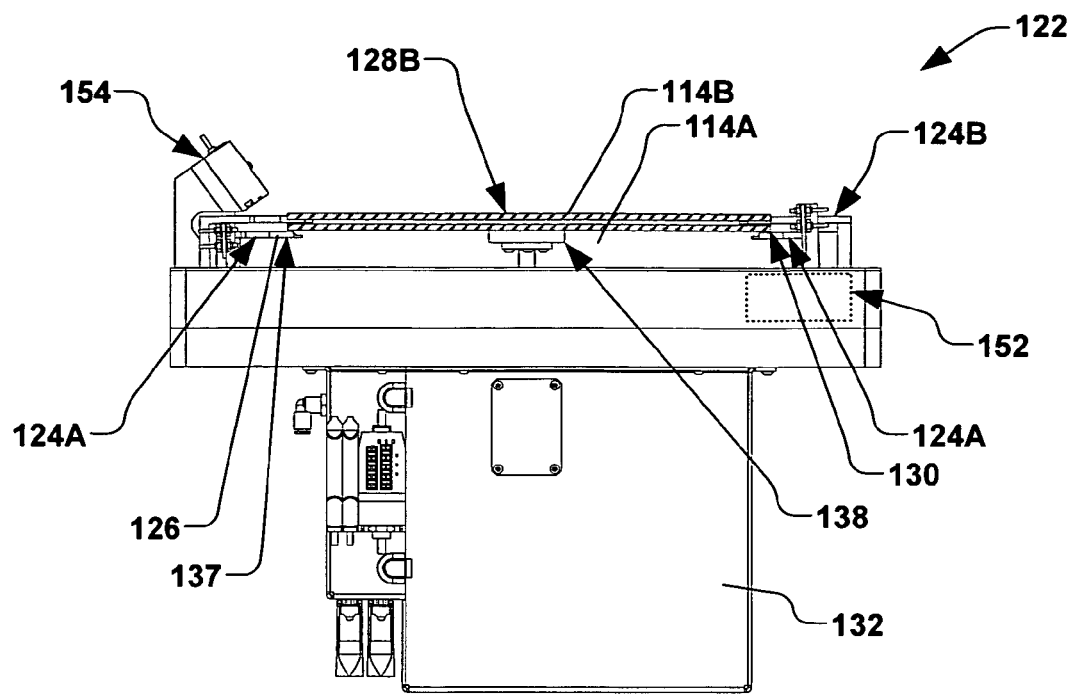

The plurality of workpiece supports 126 of the present example are further translationally coupled to a base 132 of the alignment mechanism 122, wherein the plurality of workpiece supports are further operable to radially translate (as indicated by arrows 134) with respect to the workpiece 114 and the base. Accordingly, the plurality of workpiece supports 126 of each of the workpiece tray stations 124A and 124B are operable to translate between a retracted position 136 (as illustrated in FIG. 4A for workpiece tray station 124A, and an extended position 137 (as illustrated in FIG. 4C for workpiece tray station 124A). The workpiece tray stations 124A and 124B are individually configured such that their respective workpiece supports 126 may be selectively arranged to either support the workpiece 114, or to generally permit the workpiece to move freely vertically with respect to the workpiece supports. The plurality of workpiece tray stations 124A and 124B are thus operable to selectively support each workpiece 114A and 114B illustrated in FIGS. 4A-4F, based on the respective plurality of workpiece supports being in the retracted position 136 or the extended position 137, as will be further described infra.

As illustrated in FIG. 3A, the alignment mechanism 122 further comprises an elevator device 138 operably coupled to the base 132, wherein the elevator device is configured to individually vertically translate each of the two or more workpieces 114A and 114B (shown in FIGS. 4A-4F) associated with the workpiece tray stations 124A and 124B. The alignment mechanism 122 and elevator device 138 of FIG. 3A are further illustrated in a cross-sectional view 139 in FIG. 5, wherein the exemplary elevator device comprises an elevator shaft 140 operably coupled to an elevator workpiece support 142. The elevator shaft 140, for example, is in linear sliding engagement with the base 132, wherein the elevator workpiece support 142 is thus operable to selectively support each of the plurality of workpieces 114A and 114B (e.g., illustrated in FIGS. 4A-4F) based on a presence or absence of the plurality of workpieces and position of the workpiece supports 126 of each tray station 124A and 124B.

Figure 4D:
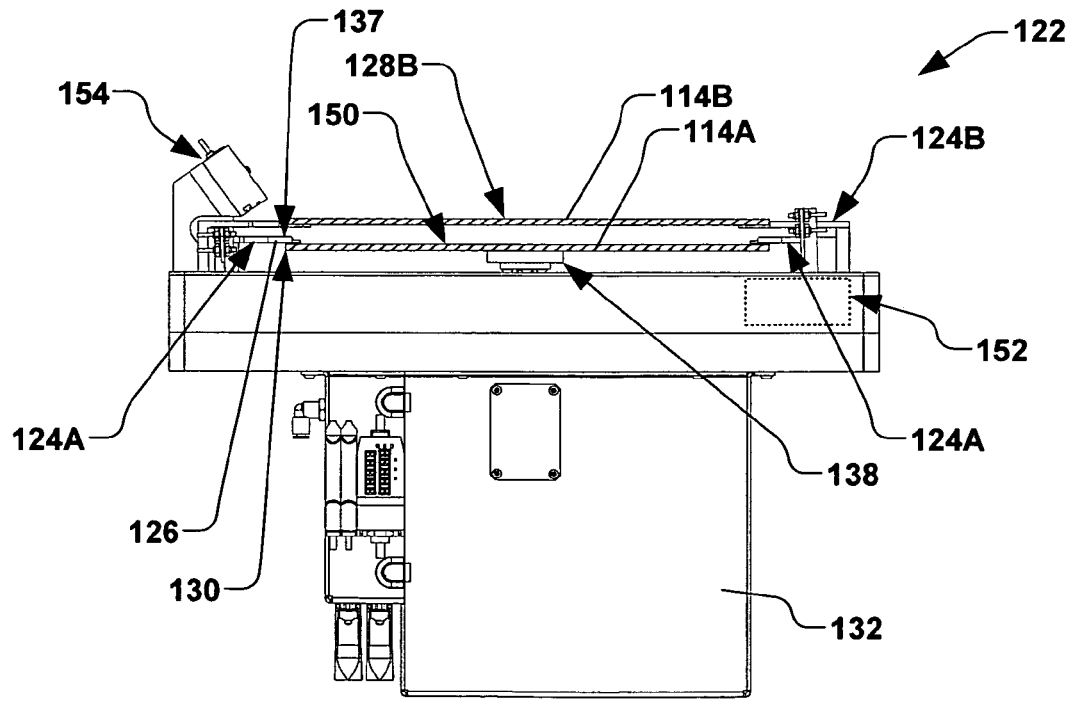
Figure 4E:
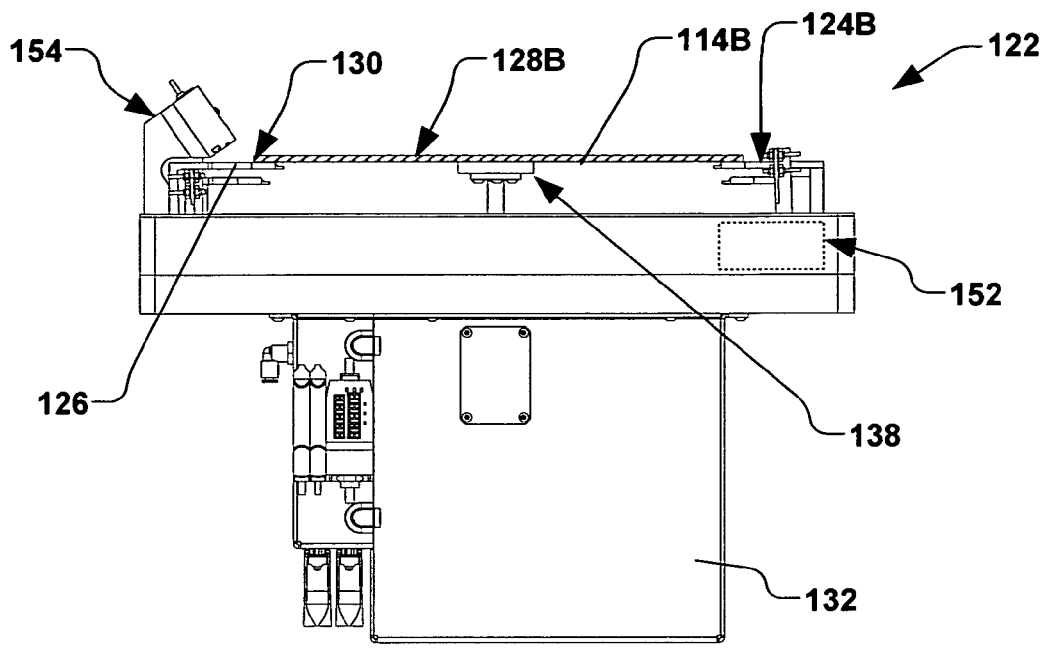
Figure 4F:
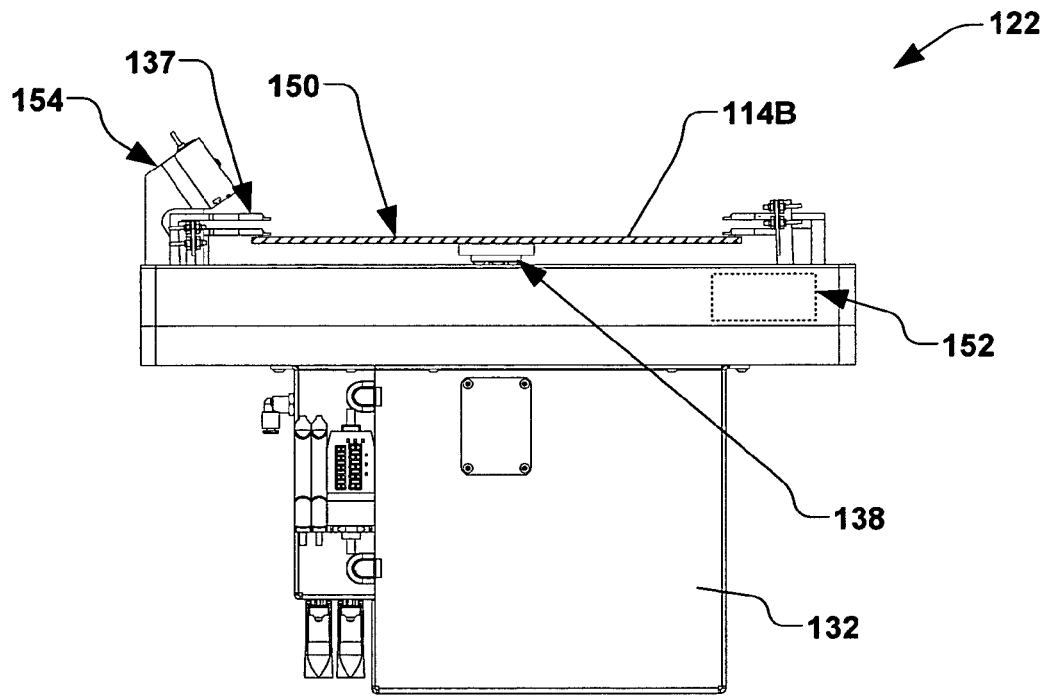
Figure 5:
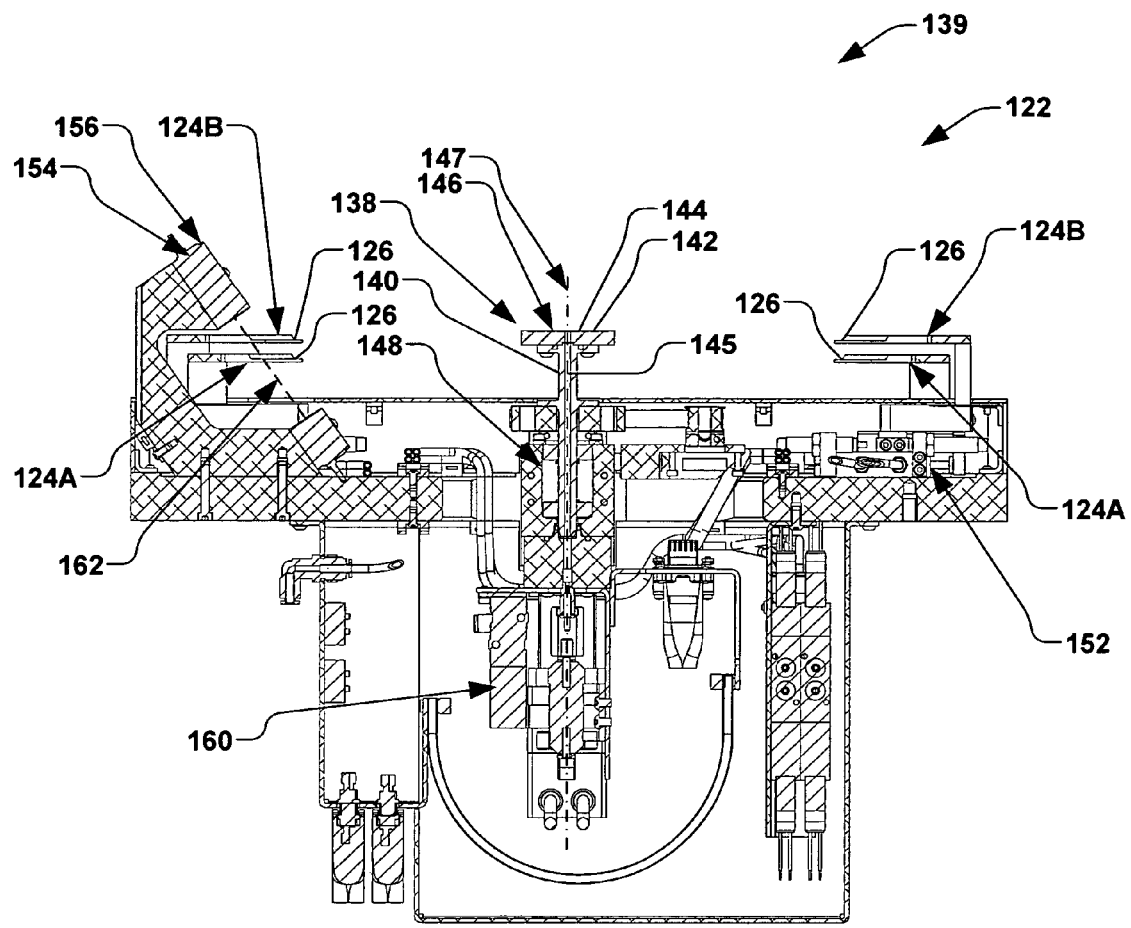
FIG. 5 is a partial cross-sectional view of the exemplary alignment mechanism of FIGS. 3A and 3B.

The elevator workpiece support 142, as illustrated in FIGS. 3A, 3B, and 5 for example, comprises a vacuum chuck 144, wherein one or more conduits 145 are operable to selectively provide a vacuum to a surface 146 of the vacuum chuck for selectively gripping each workpiece 114. As an alternative, the elevator workpiece support 142 may comprise pins (not shown), or other mechanisms operable to selectively individually support each of the plurality of workpieces 114A and 114B of FIGS. 4A-4F.

As illustrated in FIG. 5, the elevator shaft 140 is configured to linearly translate along an axis 147 thereof, wherein, for example, the elevator shaft is operably coupled to a piston and cylinder assembly 148. The piston and cylinder assembly 148, for example, is fluidly coupled to a pressure source (not shown), wherein the piston and cylinder assembly can be selectively actuated, such as by pneumatic pressure, as will be understood by one of ordinary skill in the art. Alternatively, the elevator shaft 140 can be operably coupled to a linear motor (not shown), or other mechanism operable to selectively vertically translate the elevator shaft.

An exemplary operation of the elevator device 138 of the present invention is illustrated in FIGS. 4A-4F, wherein the elevator device is operable to individually translate the two or more workpieces 114A and 114B between the respective buffer positions 128A and 128B associated with each workpiece tray station 124A and 124B and a characterization position 150 (e.g., as illustrated in FIG. 4D) for characterization of the respective workpieces. In order to translate the two or more workpieces 114A and 114B from each workpiece tray station 124A and 124B, each workpiece is generally lifted from the workpiece supports 126 when the respective workpiece tray station is in the retracted position 136 of 4A, for example, therein generally permitting the workpiece supports of the respective tray station to be radially translated to the extended position 137, such as illustrated in FIGS. 4C and 4F. Once the respective tray station 124A and/or 124B are in the extended position 137, the workpieces 124A or 124B may be vertically translated via the elevator device 138 to the characterization position 150.

According to one example, a horizontal translation device 152 illustrated in FIG. 5 is operably coupled to each of the workpiece supports 126 of the respective workpiece tray stations 124A and 124B, wherein the horizontal translation device is operable to selectively radially translate the respective workpiece support(s) between the retracted position(s) 136 and the extended position(s) 137 of FIGS. 4A-4F. The extended position 137 illustrated in FIG. 4C associated with workpiece tray station 124A, for example, is located beyond the circumference 130 of the workpieces 114A and 114B. The elevator device 138 is therefore operable to solely support and vertically translate the respective workpiece 114A and 114B when the respective workpiece tray station 124A and 124B is in the extended position 137.

Referring again to FIG. 4A, workpiece 114A is illustrated generally residing on the workpiece supports 126 of workpiece tray station 124A. In accordance with the invention, the elevator device 138 is operable to linearly translate the elevator workpiece support 142 along the axis 147, therein generally lifting and supporting the workpiece 114A from the workpiece tray station 124A, as illustrated in FIG. 4B. Once raised from the plurality of workpiece supports 126 of tray station 124A, the workpiece supports may be extended beyond the circumference 130 of the workpiece 114A to the extended position 137 via the horizontal translation device 152, as illustrated in FIG. 4C. The workpiece 114A can be then translated (e.g. raised or lowered along the axis 147) to the characterization position 150, as illustrated in FIG. 4D, for characterization thereof via one or more characterization devices 154.

It should be noted that the characterization position 150 illustrated in FIGS. 4C and 4F in the present example is shown as being generally below the buffer position 128A. Thus, a single characterization device 154 can be utilized for serial characterization of both workpieces 114A and 114B. In such a case, the characterization position 150 can reside anywhere below the buffer position 128B. However, It should be further noted that additional characterization devices (not shown) may be implemented, such that multiple characterization positions are possible both below and above buffer positions 128A and 128B, wherein workpieces 114A and 114B may be characterized, and all such characterization positions and number of characterization devices are contemplated as falling within the scope of the present invention.

The one or more characterization devices 154, for example, are operable to detect one or more characteristics associated with the plurality of workpieces 114 when each workpiece is at the characterization position 150. The characterization devices 154 may comprise one or more of an optical sensor 156, a camera 157 (illustrated in FIG. 3B), or various other detection devices, wherein the one or more characterization devices are operable to detect the one or more characteristics associated with the plurality of workpieces 114 when each workpiece is at the characterization position 150 of FIGS. 4D and 4F. The optical sensor 156, for example, is operable to detect a notch 158 in the workpiece (illustrated in FIG. 6), as will be described in greater detail hereafter. The one or more characteristics may further comprise a position of the workpiece 114 with respect to the elevator workpiece support 142, various indicia (not shown) associated with the workpiece, such as lot number, etc., or various other indicia or characteristics associated with the workpiece.

Referring again to FIG. 4D, the workpiece 114A can be removed from the alignment mechanism 122 after characterization thereof (e.g., via the first robot 110 or second robot 112 of FIG. 1A, 1B, or 2), and the elevator device 138 can then generally lift and support the workpiece 114B from the plurality of workpiece supports 126 of workpiece tray station 124B, as illustrated in FIG. 4E. Once raised from the plurality of workpiece supports 126 of tray station 124B, the workpiece supports may be likewise extended beyond the circumference 130 of the workpiece 114B to the extended position 137 of FIG. 4F, and the workpiece 114B can be then translated (e.g. lowered) to the characterization position 150 for characterization thereof. The workpiece 114B may then be removed from the alignment mechanism 122 via the first robot 110 or second robot 112 of FIGS. 1A-1B or FIG. 2 for subsequent processing.

In accordance with another exemplary aspect of the invention, as illustrated in FIG. 3B, the elevator device 138 is further rotationally coupled to the base 132, wherein the alignment mechanism is operable to individually rotate the plurality of workpieces 114 about the axis 147 associated with the elevator shaft 140 of FIG. 5. For example, a rotation device 160 such as a servo motor may be operably coupled to the elevator shaft 140, wherein the rotation device is operable to rotate the elevator shaft about the axis 147 (e.g., illustrated as arcuate arrow 161 in FIG. 3B). The rotation device 160 of FIG. 5, for example, further determines a rotational position of the elevator shaft 140 (and thus, the workpiece 114), wherein the alignment mechanism 122 is configured to further determine a position of the notch 158 (illustrated in FIG. 3B), such as for alignment of the workpiece with respect to the alignment mechanism, via the rotation of the workpiece through a beamline 162 of the optical sensor 156. The determined position of the notch 158 may be utilized to orient the workpiece 114 with respect to the alignment mechanism 122 via further rotation of the elevator shaft, for example, for subsequent processing.

Figure 6:
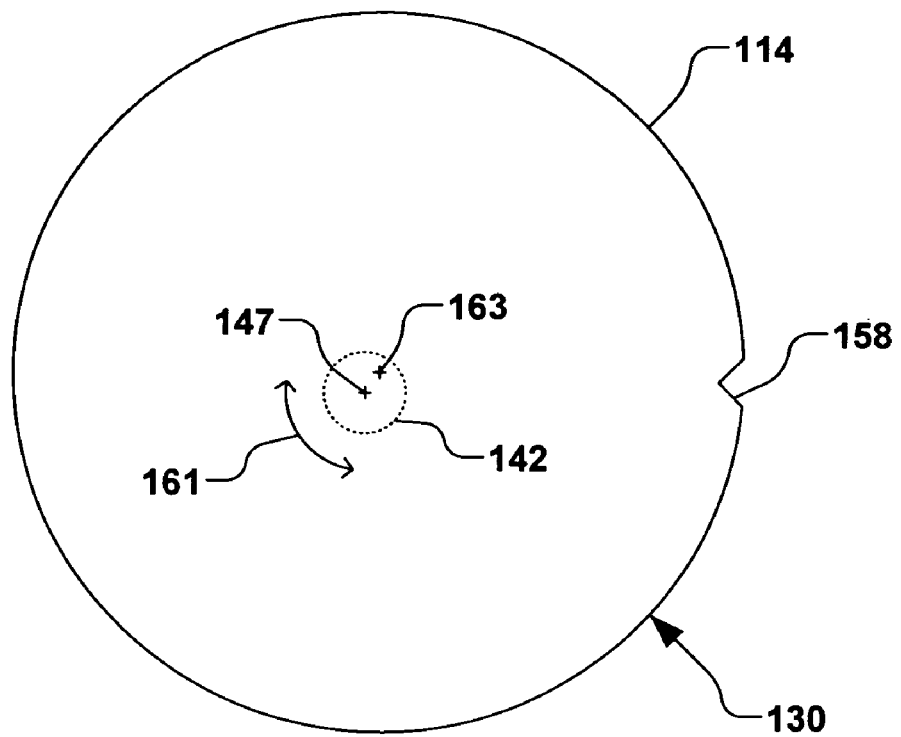
FIG. 6 is a plan view of an exemplary workpiece on a workpiece support of an exemplary alignment mechanism.
Figure 7:
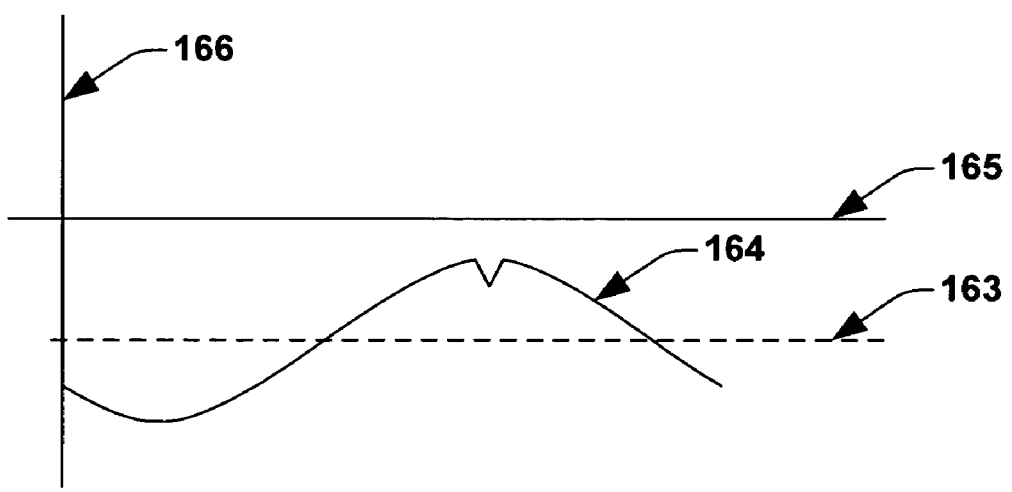
FIG. 7 is plot of a sensed position of a workpiece versus a rotational position of the workpiece support according to another exemplary aspect of the invention.

The characterization device 154 (e.g., the optical sensor 156 of FIG. 5) may be further utilized to determine a center 163 of the workpiece 114, as illustrated in FIG. 6, with respect to the rotational axis 147 of the elevator workpiece support 142 via an examination of an output from the characterization device during the rotation 161. For example, FIG. 7 illustrates a plot 164 of a rotational position 165 (e.g., provided by the servo motor of the rotation device 160) of the elevator shaft 140 and elevator workpiece support 142 of FIG. 5 versus a sensor signal 166 from the optical sensor 156, wherein the center 163 of the workpiece 114 can be extrapolated from the output signal curve (sensor signal 166) indicating the passage of the notch 158 through the beamline 162 and a knowledge of the dimensions of the notch. Accordingly, an offset vector value associated with the center 163 of the workpiece 114 can be provided to the first robot 110 and/or the second robot 112 of FIGS. 1A, 1B, and 2, wherein, in the present example, the second robot is configured to pick the workpiece 114 from the alignment mechanism 122 based on the offset vector value, and wherein the workpiece is generally centered with respect to the second dual support member 121 when it is picked from alignment mechanism. The rotational position of the workpiece 114 can be further determined from the sensor signal 166 of FIG. 7, wherein the workpiece can be further rotationally aligned with respect to the alignment mechanism 122 prior to being picked by the first or second robots 110 or 112 of FIGS. 1A, 1B, and 2.

Figure 8:
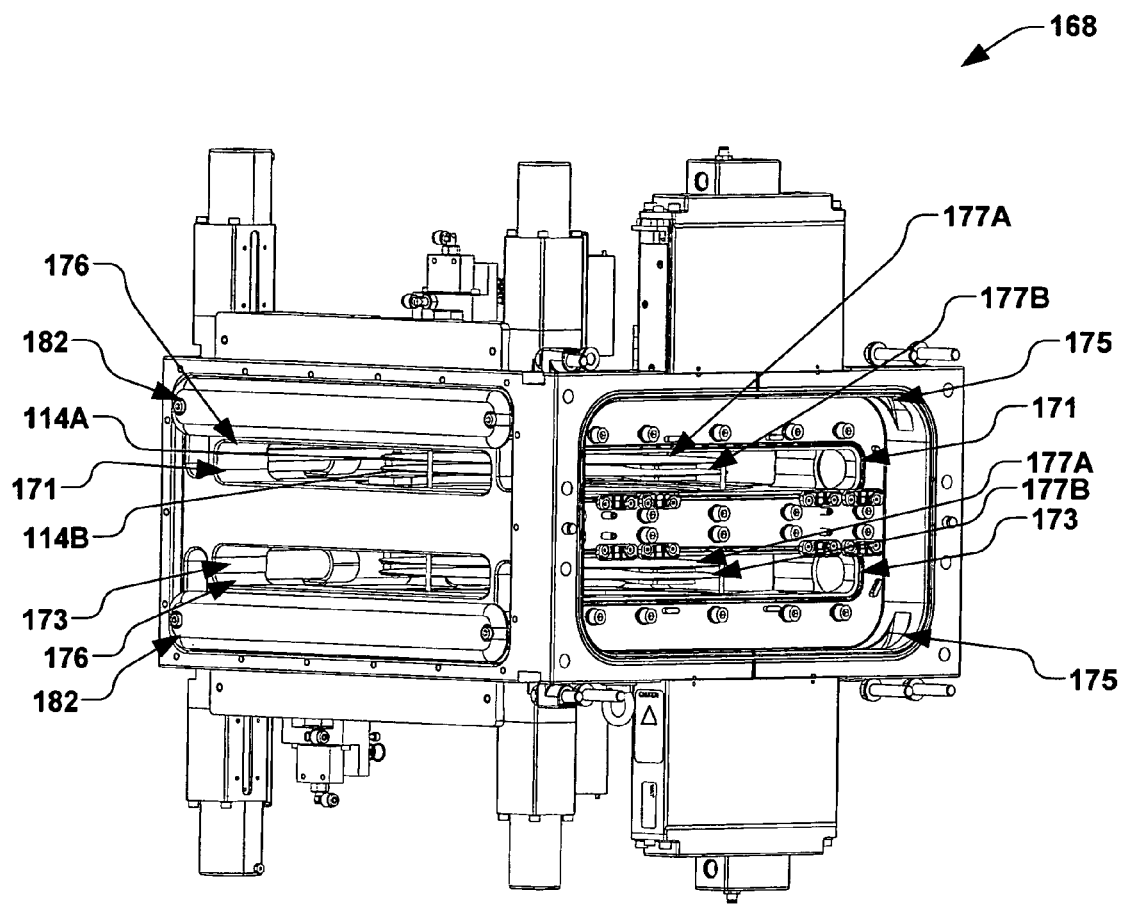
FIG. 8 is a perspective view of an exemplary load lock module according to yet another aspect of the present invention.

Referring again to FIGS. 1A and 1B, in accordance with another aspect of the invention, the workpiece handling system 100 further comprises a first load lock module 168 and a second load lock module 170 operably coupled to the front end module 102, wherein the plurality of workpieces 114 may be transferred in series or in parallel between the front end module and the first or second load lock modules. For example, a first load lock chamber 171, a second load lock chamber 172, a third load lock chamber 173, and a fourth load lock chamber 174, are further provided, wherein in the present example, the first load lock module 168 comprises the first load lock chamber and the third load lock chamber, and wherein the first and third load lock chambers are generally vertically stacked upon one another, as illustrated in FIG. 8. Further, in a similar manner, the second load lock module 170 of FIGS. 1A-1B comprises the second load lock chamber 172 and the fourth load lock chamber 174, wherein the second and fourth load lock chambers are further generally vertically stacked upon one another. It should be noted that the first load lock module 168 illustrated in FIG. 8 can be further considered to be representative second load lock module 170 of FIGS. 1A-1B, wherein similar features may be present in the first and second load lock modules.

According to the present invention, each of the first, second, third, and fourth load lock chambers 171, 172, 173, and 174 are further operable to support two or more workpieces 114 therein. Each of the first, second, third, and fourth load lock chambers 171, 172, 173, and 174 comprise a first isolation valve 175 associated with the front end module 102, wherein the first isolation valve selectively fluidly couples an internal volume 176 of the respective load lock chamber to the internal environment 109 of the front end module. According to one exemplary aspect of the invention, each respective internal volume 176 of the first, second, third, and fourth load lock chambers 171, 172, 173, and 174 is further generally separated into first and second volumes 177A and 177B, as illustrated in the exemplary first load lock module 168 FIG. 8. For example, a mechanical isolation plate (not shown) is generally disposed between the first and second volumes 177A and 177B, wherein the first volume is configured to generally confine one of the plurality of workpieces 114A, and wherein the second volume is configured to generally confine another one of the plurality of workpieces 114B. The mechanical isolation plate (not shown), for example, generally prevents cross-contamination between the first volume 177A and the second volume 177B within each respective internal volume 176.

The workpiece handling system 100 of FIGS. 1A-1B of the present invention further comprises a vacuum module 180 operably coupled to the first and second load lock modules 168 and 170, wherein the vacuum module comprises a generally evacuated internal environment 181. For example, one or more high vacuum pumps (not shown) may be operably coupled to the vacuum module 180, therein generally evacuating the vacuum module. Furthermore, each of the first, second, third, and fourth load lock chambers 171, 172, 173, and 174 comprise a second isolation valve 182 associated with the vacuum module 180 (e.g., illustrated in FIG. 8 with respect to the first load lock module 168), wherein the second isolation valve selectively fluidly couples the internal volume 176 of the respective load lock chamber to the evacuated internal environment 181 of the vacuum module.

The vacuum module 180 of FIGS. 1A-1B is further operably coupled to a processing module 184, such as an ion implanter 185 operable to form an ion beam 186. The processing module 184, for example, may comprise an electrostatic chuck 188 disposed therein, wherein the electrostatic chuck is configured to individually selectively support the one or more workpieces 114. The processing module 184 may further comprise a processing robot 190 configured to translate the electrostatic chuck 188 through a process medium 192, such as the ion beam 186 from the ion implanter 186 for implanting ions into the plurality of workpieces 114. The processing module 184 may further comprise a dosimetry system (not shown).

According to another aspect of the invention, the vacuum module 180, for example, comprises a third robot 194 and a fourth robot 196 disposed therein, wherein each of the third and fourth robots, for example, are capable of multiple degrees of freedom including vertical, radial and azimuthal movements. As illustrated in FIG. 2, the third robot 194, for example, comprises a first single-workpiece handling arm 198 operably coupled thereto, and the fourth robot 196 comprises a second single-workpiece handling arm 200 operably coupled thereto, wherein the first and second single-workpiece handling arms are each operable to support a single workpiece 114.

Accordingly, the workpiece handling system 100, as illustrated in FIGS. 1A-1B, is selectively configured to transfer two or more of the plurality of workpieces 114 in parallel (e.g., illustrated as dashed arrows 204) as well as one at a time or serially (e.g., illustrated as solid arrows 206), based on a desired flow of the workpieces through the system. The first robot 110, for example, is configured to selectively transfer two or more workpieces 114 at a time between the workpiece transport containers 106A and 106B, the alignment mechanism 122, and the second load lock module 170 via the first dual-workpiece handling arm 116. The second robot 112 is further configured to selectively transfer the two or more workpieces between the workpiece transport containers 106C and 106D, the alignment mechanism 122, and the first load lock module 168 via the second dual-workpiece handling arm 120. The second dual-workpiece handling arm 120, for example, is further configured to serially pick workpieces 114A and 114B from the alignment mechanism 122 (e.g., from the characterization position 150 of FIGS. 5D and 5F), and then transfer both workpieces in parallel to the second load lock module 170. For example, the flow of workpieces 114 through the system 100 can be reversed to service workpiece transport containers 106C and 106D, wherein the first and second robots 110 and 112 generally exchange functions, and wherein the third and fourth robots 194 and 196 likewise exchange functions, as will be appreciated by one skilled in the art. FIG. 1A, for example, illustrates a counter-clockwise flow 208 for servicing workpiece transport containers 106A and 106B, whereas FIG. 1B illustrates a clockwise flow 210 for servicing workpiece transport containers 106C and 106D.

In accordance with another aspect, the third and fourth robots 194 and 196, for example, are operable to serially transfer one workpiece 114 at a time between the process module 184 and the respective first load lock module 168 and second load lock module 170. It should be noted that the first and second isolation valves 175 and 182 associated with each of the first, second, third, and fourth load lock chambers 171, 172, 173, and 174 are operable to open and close independently; Thus, two workpieces 114 residing within the first load lock chamber 171, for example, may be pumped down to vacuum or vented while another two workpieces may be independently vented to atmosphere or pumped down to vacuum in the third load lock chamber 173 of the first load lock module 168. Likewise, two workpieces 114 residing within the second load lock chamber 172, for example, may be pumped down to vacuum or vented while another two workpieces may be independently vented to atmosphere or pumped down to vacuum in the fourth load lock chamber 174 of the second load lock module 170. Thus, in conjunction with the novel alignment mechanism 122 of the present invention, serial operations such as alignment of the plurality of workpieces 114 and processing of the workpieces through the process medium 192 may be performed while other parallel (e.g., generally simultaneous) transfers of multiple workpieces are concurrently performed elsewhere in the system.

As illustrated in FIG. 1A-1B, a controller 212 is further provided to control sequencing of workpieces through the system 100 and to control activation, deactivation and overall coordination of mechanical and environmental operations during workpiece handling and processing. For example, the controller is configured to control the front end module 102, the first and second load lock modules 168 and 170, the vacuum module 180, the processing module 184, and all components and environmental operations associated therewith. Environmental operations, for example, may comprise control of vent and pump down operations for each of the load lock chambers 171, 172, 173, and 174 and control of the vacuum environment 181 in the vacuum module 180. Mechanical operations, for example, may comprise instructing the alignment mechanism 122, workpiece transport containers 106, the first, second, third, and fourth robots 110, 112, 194, and 196 and various other workpiece handling and control of various mechanical devices associated with the system 100. The controller 212, for example, may comprise multiple individual controllers (not shown) associated with various components of the system, or may be a single controller for the whole system 100, and all such controllers are contemplated as falling within the scope of the present invention.

Figure 9:
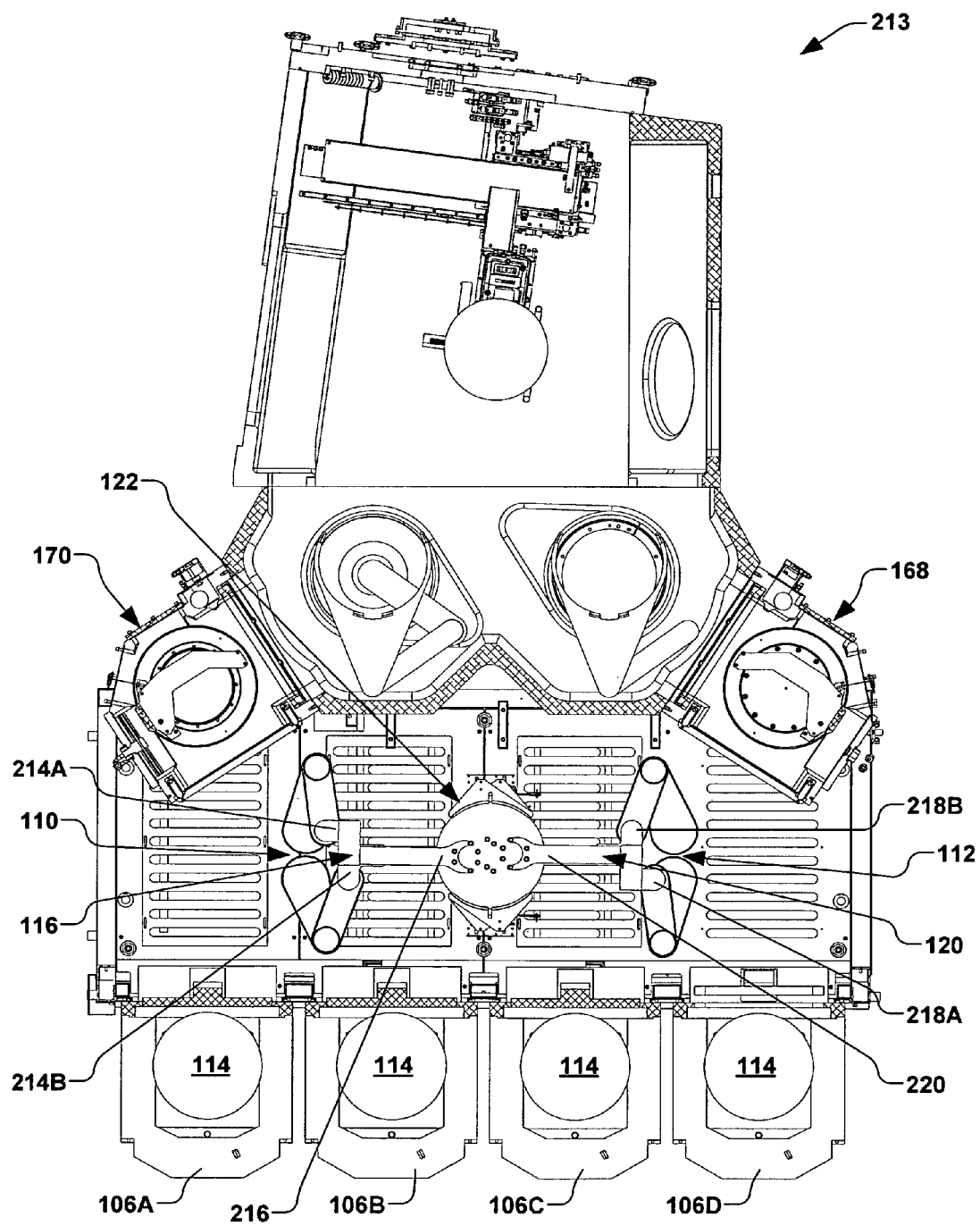
FIG. 9 illustrates another exemplary workpiece handling system according to still another aspect of the invention.
Figure 10A:
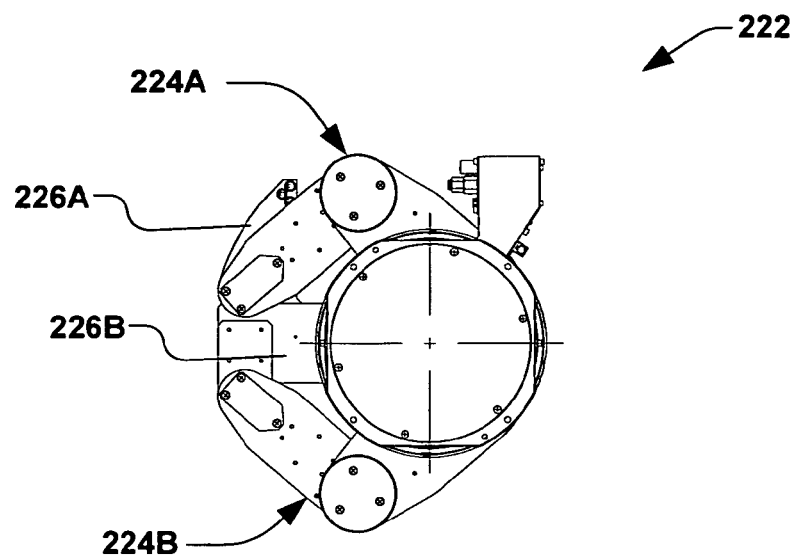
FIG. 10A illustrates a bottom plan view of an exemplary dual-workpiece handling robot of FIG. 9.
Figure 10B:
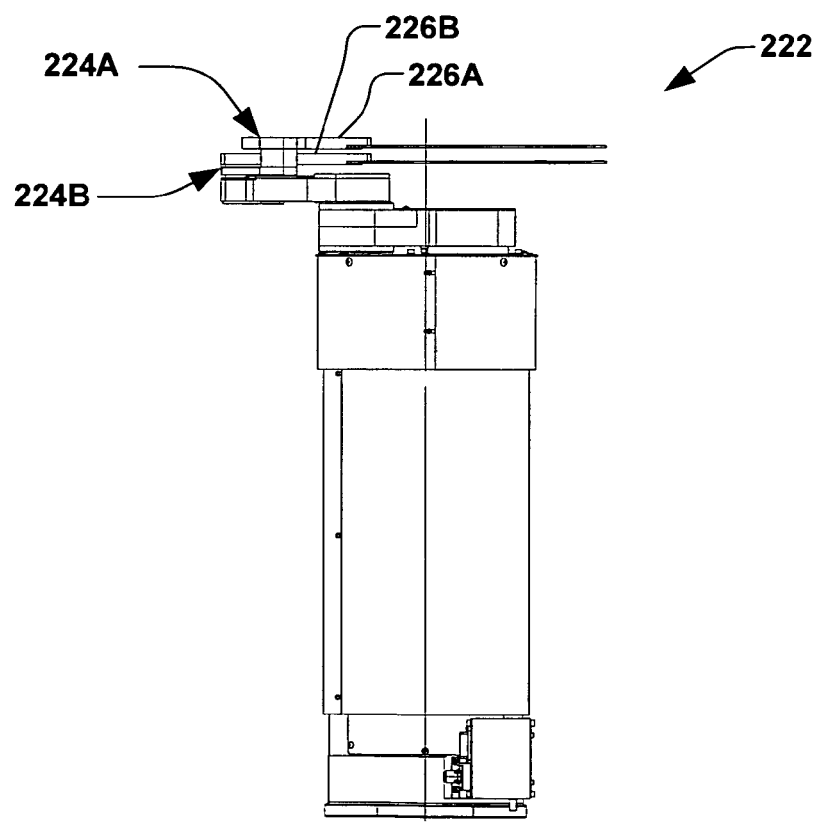
FIG. 10B illustrates an elevation view of the exemplary dual-workpiece handling robot of FIG. 10A.

FIG. 9 illustrates another exemplary system 213 of the invention, wherein the first dual workpiece handling arm 116 associated with the first robot 110 comprises a first pair of articulated arms 214A and 214B, wherein each of the first pair of articulated arms comprise a first single support member 216 configured to support a single workpiece 114. The second dual workpiece handling arm 120 associated with the second robot 112, for example, further comprises a second pair of articulated arms 218A and 218B, wherein each of the second pair of articulated arms comprise a second single support member 220 configured to support a single workpiece 114. The first pair of articulated arms 214A and 214B, for example, can be configured to individually (e.g., in series) or concurrently (e.g., in parallel) transfer two or more of the workpieces 114 between the workpiece transport containers 106A and 106B, the second load lock module 170, and the alignment mechanism 122, in a similar manner as the first dual workpiece support member 116 of FIGS. 1A-1B. Likewise, the second pair of articulated arms 218A and 218B of FIG. 9, for example, can be configured to individually or concurrently transfer two or more of the workpieces 114 between the workpiece transport containers 106C and 106D, the first load lock module 168, and the alignment mechanism 122, in a similar manner as the second dual workpiece support member 120 of FIGS. 1A-1B. FIGS. 10A and 10B illustrate several views of an exemplary robot 222. The first robot 110 and/or second robot 112 of FIGS. 1A-1B, 2, and/or 9, for example, may comprise the robot 222 shown in FIGS. 10A and 10B. As illustrated in FIGS. 10A and 10B, the robot 222 comprises articulated arms 224A and 224B, wherein each articulated arm respectively comprises a single support member 226A and 226B operably coupled thereto. Accordingly, the robot 222 is operable to translate the single support members 226A and 226B independently or in unison, based on the desired transfer of workpiece(s) as discussed above.

Figure 11:
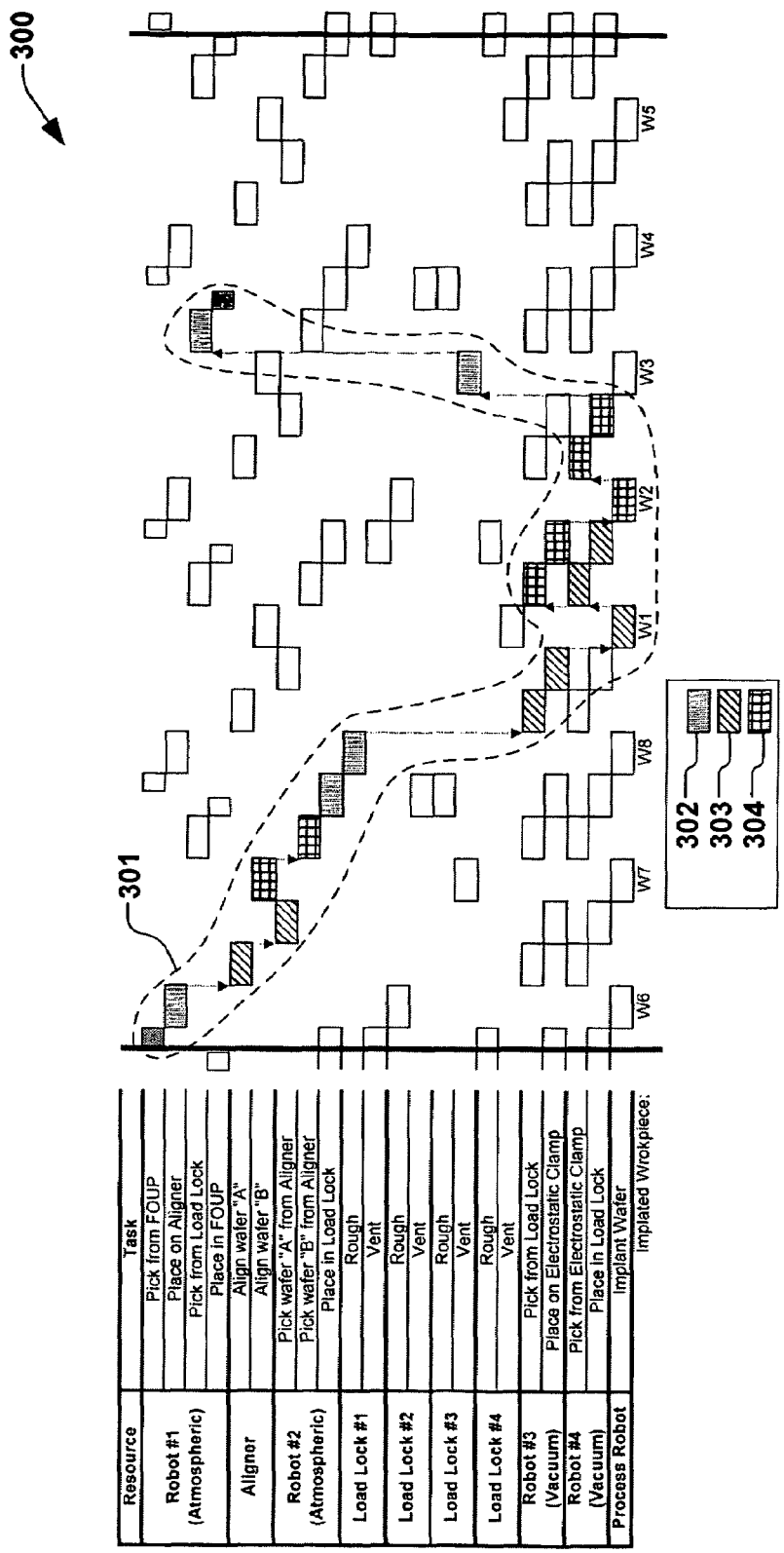
FIG. 11 is a block timing diagram for handling workpieces according to another exemplary aspect of the invention.
Figure 12:
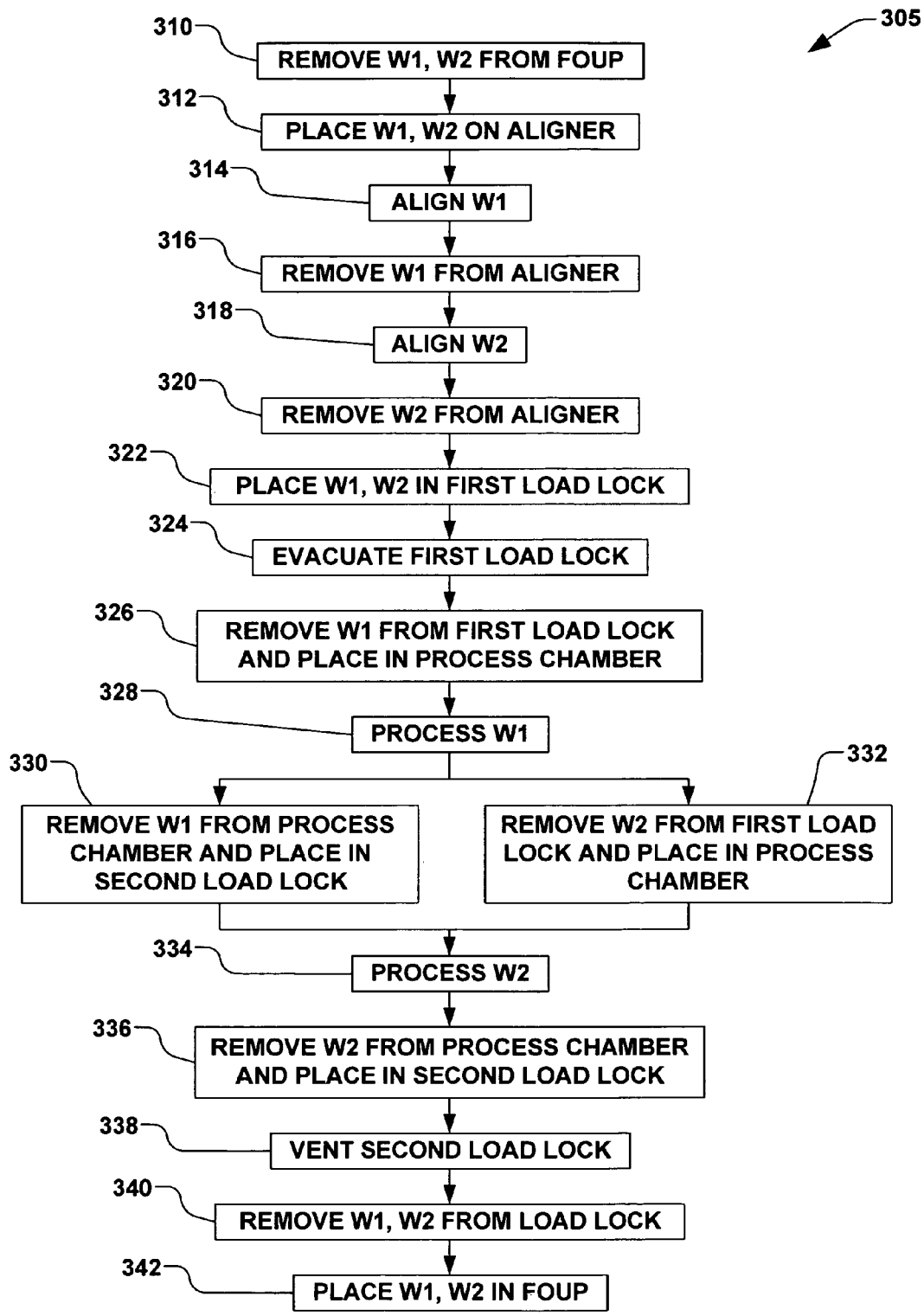
FIG. 12 is a block diagram illustrating an exemplary method for handling workpieces according to another exemplary aspect of the invention.

In accordance with another aspect of the present invention, FIG. 11 illustrates an exemplary timing diagram 300 for transferring a plurality of workpieces (e.g., eight workpieces) in a workpiece handling system associated with an ion implantation system. The system 100 illustrated in FIGS. 1A, 1B, and 2, and the system 213 illustrated in FIG. 9, for example, can be operated in accordance with the timing diagram 300 of FIG. 11. In FIG. 11, an exemplary flow 301 of first and second workpieces (workpiece "A" and workpiece "B", respectively) through the system is highlighted, wherein first hatching 302 depicts acts associated both the first workpiece and second workpiece being performed concurrently, second hatching 303 depicts acts associated with only the first workpiece (e.g., serially), and third hatching 304 depicts acts associated with only the second workpiece (e.g., serially). It is noted that acts performed on other workpieces are illustrated as having no hatching, and that such acts can be performed concurrently (in parallel) or in series with the acts associated with first and/or second workpieces Furthermore, a method 305 for transferring workpieces in a semiconductor processing system is illustrated in FIG. 12, wherein the timing diagram 300 of FIG. 11 may be further referenced. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 12, the method 305 begins at act 310, wherein a first workpiece and a second workpiece are generally concurrently removed (e.g., removed in parallel) from a first workpiece transport container by a first robot. The first and second workpieces are then generally concurrently placed on an alignment mechanism via the first robot in act 312. The first workpiece is then aligned and/or characterized in act 314. For example, the first workpiece is raised from a first workpiece support of the alignment mechanism via an elevator device. The first workpiece is further vertically translated to a characterization position, wherein the first workpiece is generally characterized, such as determining a position of a notch in the workpiece, identifying the workpiece, and/or determining a spatial orientation of the workpiece with respect to the alignment mechanism. The first workpiece is then removed from the alignment mechanism via a second robot in act 316.

The second workpiece is then aligned and/or characterized in act 318. For example, the second workpiece is raised from a second workpiece support of the alignment mechanism via the elevator device and then translated to the characterization position, wherein the second workpiece is characterized. The second workpiece is then removed from the alignment mechanism via the second robot in act 320, wherein the second robot is now generally supporting the first and second workpieces. The first and second workpieces are placed into a first load lock chamber in parallel in act 322 via the second robot, and the first load lock chamber is generally evacuated in act 324.

In act 326, the first workpiece is removed from first load lock chamber via a third robot and placed in a process chamber (e.g., placed on an electrostatic chuck in the process chamber). The first workpiece is subjected to a process medium, such as an ion beam associated with an ion implanter, in act 328, wherein ions are implanted into the first workpiece. Once ion implantation is complete, the first workpiece is removed from the process chamber via a fourth robot and placed in a second load lock chamber in act 330. At least partially concurrent to act 330, the second workpiece is removed from the first load lock chamber and placed in the process chamber via the third robot in act 332, wherein the second workpiece is implanted with ions in act 334. Once ion implantation into the second workpiece is complete, the second workpiece is removed from the process chamber via the fourth robot and placed in the second load lock chamber in act 336. Thus, the first and second workpieces are serially transported from the first load lock chamber to the process chamber for processing by the third robot, and serially transferred from the process chamber to the second load lock chamber by the fourth robot.

In act 338, the second load lock chamber is vented to generally atmospheric pressure, and the first and second workpieces are removed from the second load lock chamber in parallel via the first robot in act 340. In act 342, the first and second workpieces are placed in a second workpiece transport container. As an alternative, it should be noted that the first workpiece transport container and the second workpiece transport container can be the same workpiece transport container.

Figure 13:
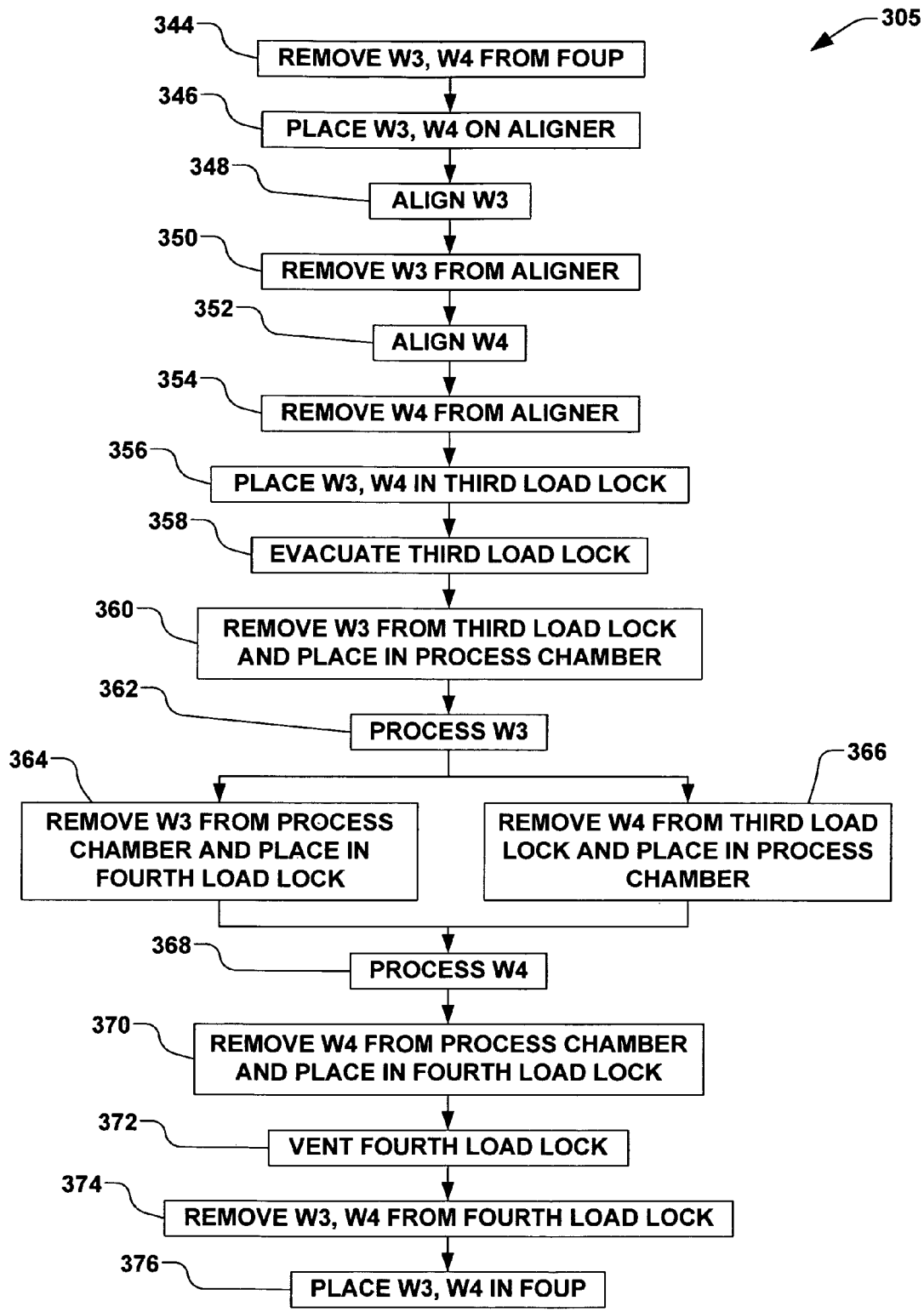
FIG. 13 is a block diagram illustrating a continuation of the exemplary method of FIG. 12 for handling workpieces according to another aspect of the invention.

Acts 310 through 342 can be further repeated for third and fourth workpieces, fifth and sixth workpieces, etc., as illustrated in the timing diagram 300 of FIG. 11. For example, FIG. 13 illustrates a continuation of the method 305 of FIG. 12, wherein the third and fourth workpieces are generally concurrently removed from the first workpiece transport container by the first robot in act 344, at least partially concurrently with act 322 of FIG. 12. The third and fourth workpieces are then placed in parallel on the alignment mechanism via the first robot in act 346 of FIG. 13. The third workpiece is then aligned in act 348 and removed from the alignment mechanism via the second robot in act 350. The fourth workpiece is then aligned in act 352, and the fourth workpiece is then removed from the alignment mechanism via the second robot in act 354, wherein the second robot is now generally supporting the third and fourth workpieces. The third and fourth workpieces are placed into a third load lock chamber in parallel in act 356 via the second robot, and the third load lock chamber is generally evacuated in act 358. In act 360, the third workpiece is removed from third load lock chamber via the third robot and placed in the process chamber via the third robot. Ions are then implanted into the third workpiece in act 362, and the third workpiece is removed from the process chamber via the fourth robot and placed in a fourth load lock chamber in act 364. At least partially concurrent to act 364, the fourth workpiece is removed from the third load lock chamber and placed in the process chamber via the third robot in act 366, wherein the fourth workpiece is implanted with ions in act 368. Once ion implantation into the fourth workpiece is complete, the fourth workpiece is removed from the process chamber via the fourth robot and placed in the fourth load lock chamber in act 370. Thus, the third and fourth workpieces are serially transported from the third load lock chamber to the process chamber for processing by the third robot, and serially transferred from the process chamber to the fourth load lock chamber by the fourth robot.

In act 372, the fourth load lock chamber is vented to generally atmospheric pressure, and the third and fourth workpieces are removed from the fourth load lock chamber in parallel via the first robot in act 374. In act 376, the third and fourth workpieces are placed back in the first workpiece transport container or the second workpiece transport container.

As illustrated in the timing diagram 300 of FIG. 11, various acts are performed at least partially concurrently with other acts. For example, acts 348, 350, 352, 354, and 376 of FIG. 13 are performed at least partially concurrently with act 324 of FIG. 12. Further, acts 326, 328, 330, and 332 are performed at least partially concurrently with acts 354 and 358 of FIG. 13. Acts 318, 320, and 322 of FIG. 12, for example, can be performed at least partially concurrently with acts 344, 346, and 372 of FIG. 13, and further, acts 362, 364, 366, and 368 can be performed at least partially concurrently with act 338. Further, as more workpieces are processed, more acts may be concurrently performed, as illustrated in the timing diagram 300 of FIG. 11, and all such concurrencies are contemplated as falling within the scope of the present invention.

Parallel processing of workpieces advantageously improves productivity of the system. For example, load lock chambers may operate in a sequential manner such that at a given point in time one load lock is open to the vacuum module, one load lock chamber is open to the front end module, one load lock chamber is venting to atmosphere, and one load lock chamber is pumping down to vacuum. Accordingly, each of the first, second, third, and fourth load lock chambers go through a sequence generally repetitively, recommencing the full cycle at generally equally phased intervals.

Accordingly, the present invention provides for a reduced cost of ownership of the processing system (e.g., an ion implantation system) by efficiently transferring workpieces between atmospheric and vacuum environments. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An alignment and buffering apparatus for determining an orientation of a plurality of workpieces, the alignment and buffering apparatus comprising:
   a base;
   a workpiece buffering device comprising a plurality of workpiece tray stations aligned generally vertically with respect to one another, wherein each workpiece tray station is operable to selectively support a respective one of the plurality of workpieces in a respective buffer position;
   an elevator device operably coupled to the base, wherein the elevator device is operable to individually vertically translate each of the plurality of workpieces from the respective buffer position to a characterization position and to rotate each respective workpiece about an axis associated therewith; and
   a characterization device associated with the characterization position, wherein the characterization device is operable to detect one or more characteristics associated with each of the plurality of workpieces when each respective workpiece is at the characterization position.

2. The alignment and buffering apparatus of claim 1, wherein each workpiece tray station comprises:
   a plurality of workpiece supports associated with a circumference of the plurality of workpieces; and
   a horizontal translation device operably coupled to the plurality of workpiece supports, wherein the horizontal translation device is operable to selectively radially translate the plurality of workpiece supports between a retracted position and an extended position, wherein the plurality of workpiece supports are operable to support the respective workpiece in the retracted position, and wherein the respective workpiece is free to vertically translate with respect to the plurality of workpiece supports in the extended position.

3. The alignment and buffering apparatus of claim 2, wherein the plurality of workpiece supports comprise two or more arcuate support members.

4. The alignment and buffering apparatus of claim 3, wherein the two or more arcuate support members each comprise an arcuate recess having a radius associated with the circumference of the plurality of workpieces, wherein at least a portion of the circumference of the respective workpiece generally rests on the arcuate recess when the plurality of workpiece supports are in the retracted position, and wherein the two or more arcuate support members are generally positioned beyond the circumference of the workpiece when the plurality of workpiece supports are in the extended position, therein generally permitting the elevator device to vertically translate the workpiece to the characterization position when the plurality of workpiece supports are in the extended position.

5. The alignment and buffering apparatus of claim 2, wherein for each workpiece tray station, the elevator device is operable to generally lift the respective workpiece from the plurality of workpiece supports when the plurality of workpiece supports are in the retracted position, and wherein the elevator device is operable to vertically translate the workpiece beyond a plane of the plurality of workpiece supports when the plurality of workpiece supports are in the extended position.

6. The alignment and buffering apparatus of claim 1, further comprising a controller configured to control the workpiece tray stations, elevator device, and characterization device.

7. The alignment and buffering apparatus of claim 1, wherein the characterization position is generally below at least one of the buffer positions.

8. The alignment and buffering apparatus of claim 1, wherein the elevator device comprises an elevator shaft operably coupled to an elevator workpiece support, wherein the elevator shaft is in linear sliding engagement with the base, and wherein the elevator workpiece support is configured to selectively support each of the plurality of workpieces.

9. The alignment and buffering apparatus of claim 8, wherein the elevator shaft is further rotationally coupled to the base.

10. The alignment and buffering apparatus of claim 9, further comprising a motor operably coupled to the elevator shaft, wherein the motor is operable to rotate the elevator shaft about the axis.

11. The alignment and buffering apparatus of claim 10, wherein the motor comprises a servo motor, and wherein the servo motor is configured to determine a rotational position of the elevator shaft with respect to the base.

12. The alignment and buffering apparatus of claim 1, wherein the characterization device comprises an optical sensor, wherein the optical sensor is operable to detect the one or more characteristics of the plurality of workpieces when each workpiece is at the characterization position.

13. The alignment and buffering apparatus of claim 1, wherein the one or more characteristics comprise one or more of a notch in the workpiece, a position of the workpiece, and an indicia associated with the workpiece.

14. An alignment and buffering apparatus, comprising:
   a base;
   a first workpiece tray station configured to selectively support a first workpiece, therein defining a first buffer position;
   a second workpiece tray station configured to selectively support a second workpiece, therein defining a second buffer position, wherein the first buffer position and second buffer position are generally aligned vertically;
   an elevator device operably coupled to the base, wherein the elevator device is configured to selectively translate each of the first workpiece and second workpiece along an axis between the respective first buffer position and second buffer position and a characterization position, and wherein the elevator device comprises an elevator shaft coupled to an elevator workpiece support, wherein the elevator shaft is in linear sliding engagement with the base along the axis and further rotationally coupled thereto, and wherein the elevator workpiece support is configured to selectively individually support each of the first workpiece and second workpiece; and
   a characterization device operable to detect one or more characteristics associated with the first and second workpieces when each respective first and second workpiece is at the characterization position.

15. The alignment and buffering apparatus of claim 14, further comprising a motor operably coupled to the elevator shaft, wherein the motor is operable to rotate the elevator shaft about the axis.

16. The alignment and buffering apparatus of claim 15, wherein the motor comprises a servo motor.

17. The alignment and buffering apparatus of claim 14, wherein the characterization device comprises an optical sensor, wherein the optical sensor is operable to detect the one or more visual characteristics of the first and second workpieces when the respective first and second workpiece is at the characterization position.

18. The alignment and buffering apparatus of claim 17, wherein the one or more visual characteristics comprise one or more of a notch in a circumference of the respective first and second workpiece, a position of the respective first and second workpiece, and an indicia associated with the respective first and second workpiece.

19. The alignment and buffering apparatus of claim 18, wherein the position of the respective first and second workpiece comprises one or more of a rotational position of the respective first and second workpiece with respect to the base and a center of the respective first and second workpiece with respect to the elevator workpiece support.

20. The alignment and buffering apparatus of claim 14, wherein the elevator workpiece support comprises a vacuum chuck operable to selectively grip each of the respective first and second workpieces.

21. The alignment and buffering apparatus of claim 14, further comprising a controller operable to control the first and second tray stations, the elevator device, and the characterization device.

22. The alignment and buffering apparatus of claim 21, wherein characterization position is positioned generally vertically below one or more of the first and second buffer positions.

23. An alignment and buffering apparatus, comprising:
a base;
a first workpiece tray station configured to selectively support a first workpiece, therein defining a first buffer position;
a second workpiece tray station configured to selectively support a second workpiece, therein defining a second buffer position, wherein the first buffer position and second buffer position are generally aligned vertically; and
an elevator device operably coupled to the base, wherein the elevator device is configured to selectively translate each of the first workpiece and second workpiece along an axis between the respective first buffer position and second buffer position and a characterization position, and wherein each of the first and second workpiece tray stations respectively comprise:
a plurality of workpiece supports each having an arcuate recess defined therein, wherein a radius of the arcuate recess is associated with a circumference of the first and second workpieces; and
a horizontal translation device operably coupled to the plurality of workpiece supports and the base, wherein the horizontal translation device is configured to selectively radially translate the plurality of workpiece supports with respect to the axis between a retracted position and an extended position.

24. The alignment and buffering apparatus of claim 23, wherein the arcuate recesses of the respective plurality of workpiece supports are configured to selectively engage at least a portion of the circumference of the respective first or second workpiece when the plurality of workpiece supports are in the retracted position, and wherein a distance between the arcuate recesses of the plurality of workpiece supports is greater than a diameter of the first and second workpieces when the plurality of workpiece supports are in the extended position, wherein the respective first or second workpiece is free to vertically translate with respect to the plurality of workpiece supports when the plurality of workpiece supports are in the extended position.

25. The alignment and buffering apparatus of claim 24, wherein the elevator device is configured to selectively lift the respective first or second workpiece from the respective first or second workpiece tray station when the respective plurality of workpiece supports are in the retracted position, and wherein the elevator device is further configured to selectively translate the respective first or second workpiece along the axis to the characterization position when the plurality of workpiece supports are in the extended position.

26. A method for aligning and buffering workpieces, the method comprising:
providing an alignment mechanism having first workpiece tray station, a second workpiece tray station, and a vertically-translating elevator device, wherein the first workpiece tray station is aligned generally vertically beneath the second workpiece tray station, and wherein each of the first and second workpiece tray stations comprise a plurality of workpiece supports;
generally concurrently placing first and second workpieces on the plurality of workpiece supports associated with the respective first and second workpiece tray stations;
raising the first workpiece from the plurality of workpiece supports of the first workpiece tray station via the elevator device;
vertically translating the first workpiece to a characterization position via the elevator device;
characterizing the first workpiece;
removing the first workpiece from the alignment mechanism;
raising the second workpiece from the plurality of workpiece supports of the second workpiece tray station via the elevator device;
vertically translating the second workpiece to the characterization position;
characterizing the second workpiece; and
removing the second workpiece from the alignment mechanism.

27. The method of claim 26, wherein generally concurrently placing first and second workpieces on the plurality of workpiece supports comprises lowering the first and second workpieces onto the plurality of workpiece supports when the plurality of workpiece supports associated with both the first and second workpiece tray stations are in a retracted position.

28. The method of claim 27, wherein the first workpiece is raised from the plurality of workpiece supports of the first workpiece tray station when the plurality of workpiece supports of the first workpiece tray station are in the retracted position.

29. The method of claim 28, wherein the characterization position is generally below the first workpiece tray station, wherein vertically translating the first workpiece to the characterization position comprises radially translating the plurality of workpiece supports of the first workpiece tray station from the retracted position to an extended position, and translating the first workpiece between the plurality of workpiece supports of the first workpiece tray station to the characterization position.

30. The method of claim 27, wherein the second workpiece is raised from the plurality of workpiece supports of the second workpiece tray station when the plurality of workpiece supports of the second workpiece tray station are in the retracted position.

31. The method of claim 30, wherein the characterization position is generally below the first workpiece tray station, wherein vertically translating the second workpiece to the characterization position comprises radially translating the plurality of workpiece supports of the first workpiece tray station and second workpiece tray station from the retracted position to an extended position, and translating the second workpiece between the plurality of workpiece supports of the first workpiece tray station and second workpiece tray station to the characterization position.

32. The method of claim 30, wherein the characterization position is generally between the first workpiece tray station and the second workpiece tray station, wherein vertically translating the second workpiece to the characterization position comprises radially translating the plurality of workpiece supports of the second workpiece tray station from the retracted position to an extended position, and translating the second workpiece between the plurality of workpiece supports of the second workpiece tray station to the characterization position.

33. The method of claim 26, wherein characterizing the first and second workpieces comprises:
   respectively rotating the first and second workpieces about an axis of the elevator device; and
   determining one or more characteristics associated with the respective first and second workpieces during the respective rotation.

34. The method of claim 33, wherein determining the one or more characteristics comprises determining a rotational orientation of the respective first and second workpieces with respect to the alignment mechanism, an offset position of the respective first and second workpiece with respect to the axis, and an indicia associated with the respective first and second workpieces.

35. The method of claim 34, wherein determining the rotational orientation of the respective first and second workpieces comprises:
   providing an optical sensor having a beamline directed toward a circumference of the first and second workpieces when the first and second workpieces are at the characterization position;
   obtaining a signal from the optical sensor as the circumference of the respective first and second workpiece passes through the beamline of the optical sensor during the respective rotation thereof; and
   determining a position of a notch in the circumference of the respective first and second workpiece based on the signal obtained from the optical sensor and a knowledge of dimensional information associated with the notch.

36. The method of claim 35, further comprising:
   rotating the respective first and second workpieces to a predetermined rotational position via the elevator device based on the determined position of the notch.

37. The method of claim 35, wherein determining the offset position of the respective first and second workpiece with respect to the axis comprises:
   determining a rotational position of the elevator device; and
   analyzing the signal obtained from the optical sensor as the circumference of the respective first and second workpiece passes through the beamline of the optical sensor during the respective rotation thereof, and extrapolating an offset vector based on a linearity of the obtained signal and rotational position of the elevator device.

* * * * *